(12) United States Patent
Shimamura et al.

(10) Patent No.: US 12,167,545 B2
(45) Date of Patent: Dec. 10, 2024

(54) MULTILAYER SUBSTRATE

(71) Applicant: Murata Manufacturing Co., Ltd., Nagaokakyo (JP)

(72) Inventors: Takayuki Shimamura, Nagaokakyo (JP); Yusuke Kamitsubo, Nagaokakyo (JP); Ryutatsu Mizukami, Nagaokakyo (JP); Sunao Fukutake, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 193 days.

(21) Appl. No.: 18/082,619

(22) Filed: Dec. 16, 2022

(65) Prior Publication Data

US 2023/0118261 A1 Apr. 20, 2023

Related U.S. Application Data

(63) Continuation of application No. PCT/JP2021/023697, filed on Jun. 23, 2021.

(30) Foreign Application Priority Data

Jun. 30, 2020 (JP) .................. 2020-113184

(51) Int. Cl.
  *H05K 3/46* (2006.01)
  *H05K 1/02* (2006.01)
  *H05K 3/40* (2006.01)

(52) U.S. Cl.
  CPC ......... *H05K 3/4632* (2013.01); *H05K 1/0298* (2013.01); *H05K 3/4069* (2013.01); *H05K 2201/0129* (2013.01)

(58) Field of Classification Search
  CPC .................................................... H05K 3/4632
  (Continued)

(56) References Cited

U.S. PATENT DOCUMENTS

| 5,248,530 A | 9/1993 | Jester et al. |
| 5,719,354 A | 2/1998 | Jester et al. |

(Continued)

FOREIGN PATENT DOCUMENTS

| JP | 05226796 A | 9/1993 |
| JP | 0897565 A | 4/1996 |

(Continued)

OTHER PUBLICATIONS

International Search Report in PCT/JP2021/023697, mailed Sep. 14, 2021, 3 pages.

(Continued)

*Primary Examiner* — Stanley Tso
(74) *Attorney, Agent, or Firm* — Keating & Bennett, LLP

(57) ABSTRACT

A multilayer substrate includes a resin multilayer body including, in a lamination direction, first and second laminate portions respectively including first and second thermoplastic resin layers, and a first interlayer connection conductor extending through the first thermoplastic resin layer. A storage elastic modulus of the first thermoplastic resin layer is lower than that of the second thermoplastic resin layer at a measurement temperature equal to or higher than a minimum melting point among melting points of metallic elements included in the first interlayer connection conductors and equal to or lower than melting points of the first thermoplastic resin layer and the second thermoplastic resin layer.

19 Claims, 4 Drawing Sheets

(58) Field of Classification Search
USPC .......................................................... 174/255
See application file for complete search history.

(56) References Cited

U.S. PATENT DOCUMENTS

| | | |
|---|---|---|
| 2017/0149111 A1 | 5/2017 | Yosui et al. |
| 2018/0213643 A1* | 7/2018 | Adachi ................ H05K 3/4644 |
| 2021/0212203 A1* | 7/2021 | Kamitsubo ............. B32B 7/022 |

FOREIGN PATENT DOCUMENTS

| | | |
|---|---|---|
| JP | 2005175279 A | 6/2005 |
| JP | 2009065009 A | 3/2009 |
| JP | 6048633 B1 | 12/2016 |
| JP | 2020072198 A | 5/2020 |
| WO | 2017081981 A1 | 5/2017 |
| WO | 2019035384 A1 | 2/2019 |
| WO | 2020071473 A1 | 4/2020 |

OTHER PUBLICATIONS

Written Opinion in PCT/JP2021/023697, mailed Sep. 14, 2021, 3 pages.
Office Action in JP2022-533900, mailed Jan. 31, 2023, 3 pages.

* cited by examiner

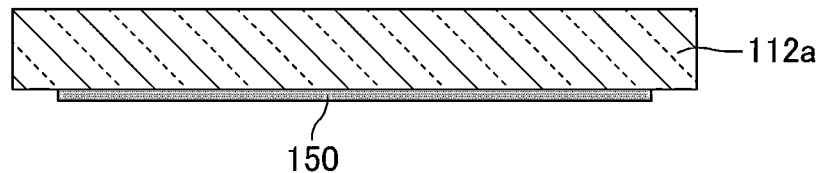
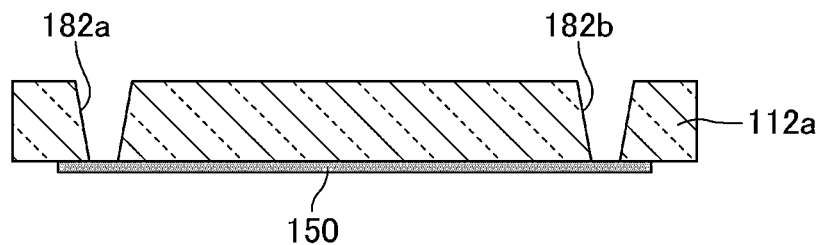
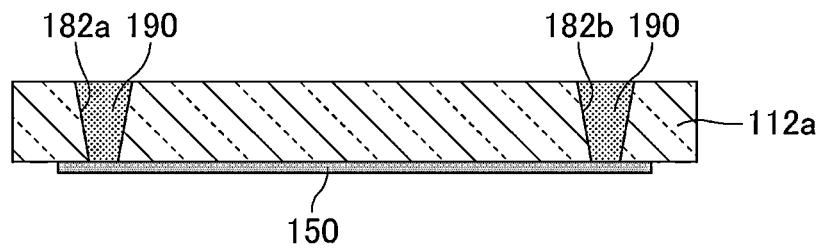
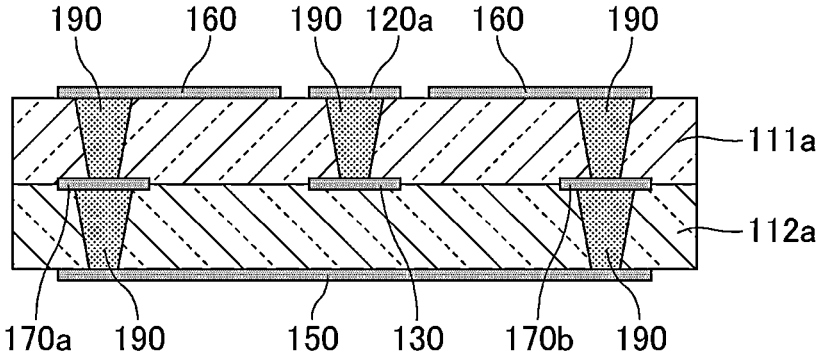
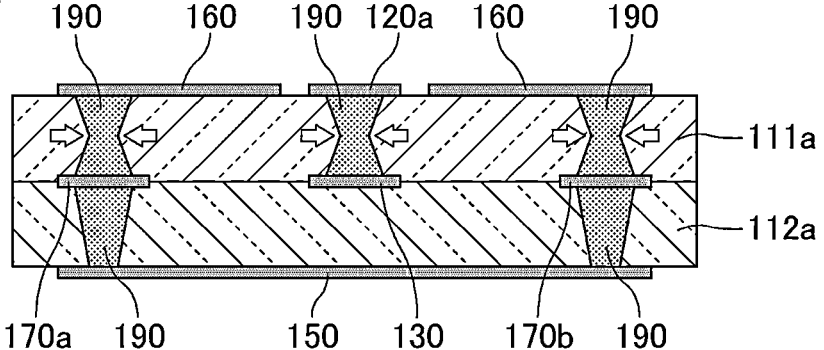

MULTILAYER SUBSTRATE

CROSS REFERENCE TO RELATED APPLICATIONS

This application claims the benefit of priority to Japanese Patent Application No. 2020-113184 filed on Jun. 30, 2020 and is a Continuation Application of PCT Application No. PCT/JP2021/023697 filed on Jun. 23, 2021. The entire contents of each application are hereby incorporated herein by reference.

BACKGROUND OF THE INVENTION

1. Field of the Invention

The present invention relates to a multilayer substrate.

2. Description of the Related Art

As a multilayer substrate used in a variety of electronic devices, for example, Japanese Patent No. 6048633 discloses a composite transmission line configured such that a plurality of signal transmission lines and a power transmission line are formed in a laminated insulator in which a plurality of insulator layers are laminated, the plurality of signal transmission lines including at least a first signal transmission line and a second signal transmission line, the first signal transmission line including a first signal conductor pattern, the second signal transmission line including a second signal conductor pattern, the power transmission line is defined by a power transmission conductor pattern formed along a plurality of layers of the laminated insulator and an interlayer connection conductor for interlayer-connecting the power transmission conductor patterns, the first signal conductor pattern, the second signal conductor pattern, and the power transmission conductor pattern being formed in parallel in different layers of the laminated insulator, the first signal conductor pattern and the second signal conductor pattern being disposed with a first ground conductor interposed therebetween in a lamination direction of the insulator layers, and the power transmission line being disposed on a side portion of the first signal conductor pattern.

In the composite transmission line described in Japanese Patent No. 6048633, the signal conductor pattern, the power transmission conductor pattern, and the ground conductor are each connected to the interlayer connection conductor. However, depending on conditions for forming such a composite transmission line, in particular, conditions for laminating a plurality of insulator layers provided with various conductors, connectivity between each of the signal conductor pattern, the power transmission conductor pattern, and the ground conductor and the interlayer connection conductor may be degraded. Such a decrease in connectivity with the interlayer connection conductor has a greater influence on characteristics such as high-frequency characteristics with respect to the signal conductor pattern or the power transmission conductor pattern than to the ground conductor.

SUMMARY OF THE INVENTION

Preferred embodiments of the present invention provide multilayer substrates each having excellent connectivity between a conductor pattern for signal or power transmission and an interlayer connection conductor.

A multilayer substrate according to a preferred embodiment of the present invention includes a resin multilayer body with a laminated structure including, in a lamination direction, a first laminate portion made of at least one first thermoplastic resin layer and a second laminate portion adjacent to the first laminate portion and made of at least one second thermoplastic resin layer, and includes a first main surface on a side of the first laminate portion and a second main surface on a side of the second laminate portion, the first main surface and the second main surface facing each other in the lamination direction, a surface electrode on the first main surface of the resin multilayer body, a first conductor pattern providing signal or power transmission between the first laminate portion and the second laminate portion, and at least one first interlayer connection conductor extending through the first thermoplastic resin layer in the lamination direction and electrically connects the surface electrode and the first conductor pattern, wherein, in the lamination direction, one surface of the first conductor pattern on the surface electrode side is connected to the first interlayer connection conductor, and another surface of the first conductor pattern on a side opposite to the surface electrode is not connected to an interlayer connection conductor, the first interlayer connection conductor includes a resin and at least one kind of metallic element, and a storage elastic modulus of the first thermoplastic resin layer is lower than a storage elastic modulus of the second thermoplastic resin layer at a measurement temperature equal to or higher than a minimum melting point among melting points of the metallic elements included in the first interlayer connection conductor and equal to or lower than melting points of the first thermoplastic resin layer and the second thermoplastic resin layer.

According to preferred embodiments of the present invention, it is possible to provide multilayer substrates each having excellent connectivity between a conductor pattern for signal or power transmission and an interlayer connection conductor.

The above and other elements, features, steps, characteristics and advantages of the present invention will become more apparent from the following detailed description of the preferred embodiments with reference to the attached drawings.

BRIEF DESCRIPTION OF DRAWINGS

FIG. 8 is a schematic cross-sectional view illustrating an example of a step of forming a conductor layer on one surface of a second thermoplastic resin sheet in the method for manufacturing the multilayer substrate according to Preferred Embodiment 1 of the present invention.

FIG. 9 is a schematic cross-sectional view illustrating an example of a step of forming a via hole in the second thermoplastic resin sheet in the method for manufacturing the multilayer substrate according to Preferred Embodiment 1 of the present invention.

FIG. 10 is a schematic cross-sectional view illustrating an example of a step of filling a via hole of the second thermoplastic resin sheet with a conductive paste in the method for manufacturing the multilayer substrate according to Preferred Embodiment 1 of the present invention.

FIG. 11 is a schematic cross-sectional view illustrating an example of a step of laminating and thermal pressure bonding the first thermoplastic resin sheet and the second thermoplastic resin sheet in the method for manufacturing the multilayer substrate according to Preferred Embodiment 1 of the present invention.

FIG. 12 is a schematic cross-sectional view illustrating an example of a step of laminating and thermal pressure bonding the first thermoplastic resin sheet and the second thermoplastic resin sheet in the method for manufacturing the multilayer substrate according to Preferred Embodiment 1 of the present invention.

DETAILED DESCRIPTION OF THE PREFERRED EMBODIMENTS

Hereinafter, multilayer substrates according to preferred embodiments of the present invention will be described. The present invention is not limited to the following preferred embodiments, and may be appropriately changed without departing from the gist of the present invention. In addition, a combination of a plurality of individual preferred embodiments described below is also included in the present invention.

Each preferred embodiment described below is an example, and partial replacement or combination of configurations described in different preferred embodiments is possible. In Preferred Embodiment 2 and thereafter, a description of matters common to Preferred Embodiment 1 will be omitted, and different points will be mainly described. In particular, the same or similar operations and advantageous effects obtained by the same or similar configurations will not be described in sequence in each preferred embodiment.

Preferred Embodiment 1

Figure 1:
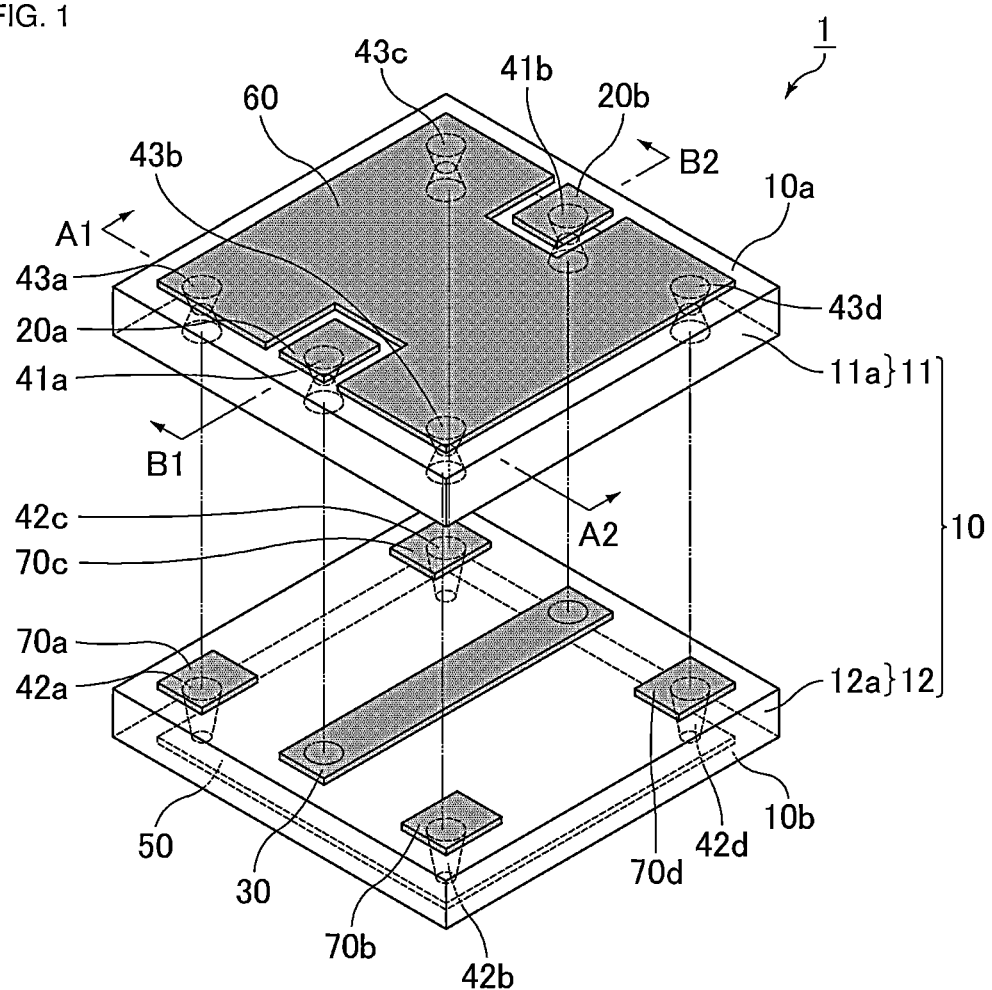
FIG. 1 is an exploded schematic perspective view illustrating a multilayer substrate according to Preferred Embodiment 1 of the present invention.
Figure 2:
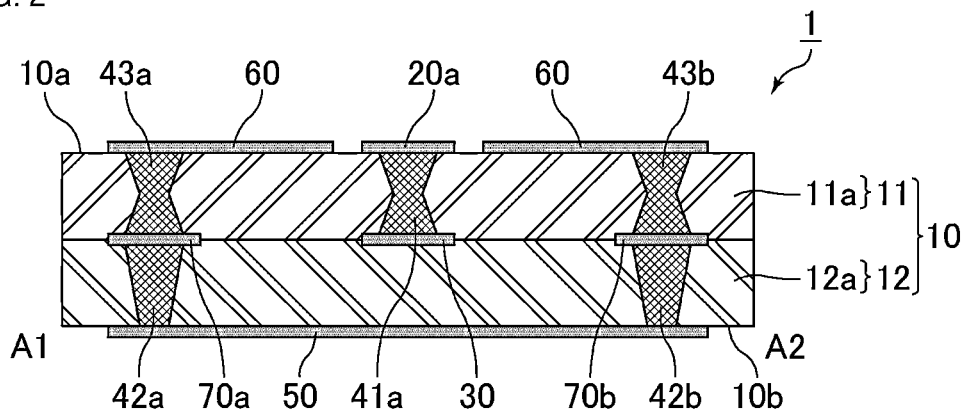
FIG. 2 is a schematic cross-sectional view illustrating a portion corresponding to a line segment A1-A2 in FIG. 1.
Figure 3:
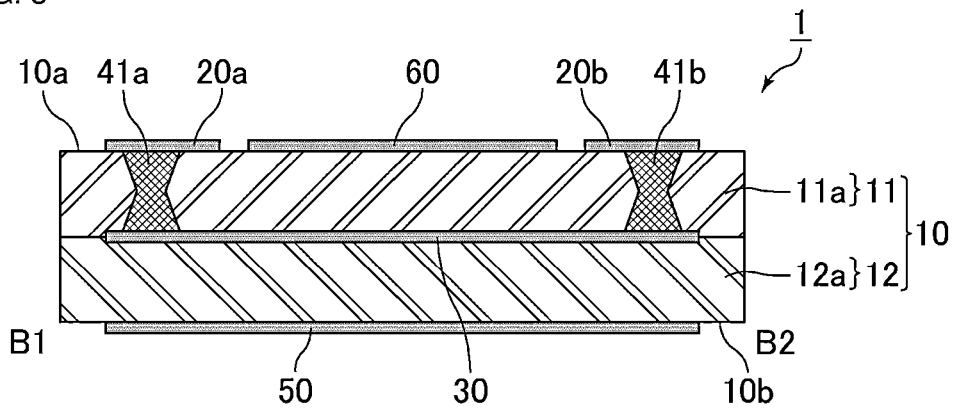
FIG. 3 is a schematic cross-sectional view illustrating a portion corresponding to a line segment B1-B2 in FIG. 1.

FIG. 1 is an exploded schematic perspective view illustrating a multilayer substrate according to Preferred Embodiment 1 of the present invention. FIG. 2 is a schematic cross-sectional view illustrating a portion corresponding to a line segment A1-A2 in FIG. 1. FIG. 3 is a schematic cross-sectional view illustrating a portion corresponding to a line segment B1-B2 in FIG. 1.

As illustrated in FIG. 1, FIG. 2, and FIG. 3, a multilayer substrate 1 includes a resin multilayer body 10, a surface electrode 20a, a surface electrode 20b, a first conductor pattern 30 for signal or power transmission, a first interlayer connection conductor 41a, and a first interlayer connection conductor 41b.

The resin multilayer body 10 has a laminated structure including a first laminate portion 11 and a second laminate portion 12 adjacent to the first laminate portion 11 in a lamination direction (vertical direction in FIG. 1, FIG. 2, and FIG. 3).

The first laminate portion 11 includes a first thermoplastic resin layer 11a.

The second laminate portion 12 includes a second thermoplastic resin layer 12a.

Examples of thermoplastic resin if the first thermoplastic resin layer 11a and the second thermoplastic resin layer 12a include liquid crystal polymers (LCPs), fluorine resin, thermoplastic polyimide resins, polyetheretherketone resins (PEEK), polyphenylene sulfide resins (PPS), and the like.

The thermoplastic resins of the first thermoplastic resin layer 11a and the second thermoplastic resin layer 12a may be the same as or different from each other.

Each of the first thermoplastic resin layer 11a and the second thermoplastic resin layer 12a may include, for example, a liquid crystal polymer as a main component. Therefore, in the multilayer substrate 1, when each of the first thermoplastic resin layer 11a and the second thermoplastic resin layer 12a includes the liquid crystal polymer as a main component, a change in electrical characteristics due to moisture intrusion is less likely to occur because the liquid crystal polymer has lower water absorbing property than other thermoplastic resins.

When each of the first thermoplastic resin layer 11a and the second thermoplastic resin layer 12a includes a liquid crystal polymer as a main component, it is preferable that the molecular weight of the liquid crystal polymer of the first thermoplastic resin layer 11a and the molecular weight of the liquid crystal polymer of the second thermoplastic resin layer 12a are different from each other. By changing the molecular weights of the liquid crystal polymer between the first thermoplastic resin layer 11a and the second thermoplastic resin layer 12a, the storage elastic modulus of the first thermoplastic resin layer 11a can be made lower than the storage elastic modulus of the second thermoplastic resin layer 12a, as described later.

In a multilayer substrate according to a preferred embodiment of the present invention, the first laminate portion includes at least one first thermoplastic resin layer. That is, the first laminate portion includes only the first thermoplastic resin layer and includes at least one first thermoplastic resin layer.

In a multilayer substrate according to a preferred embodiment of the present invention, the second laminate portion includes at least one second thermoplastic resin layer. That is, the second laminate portion includes only the second thermoplastic resin layer and includes at least one second thermoplastic resin layer.

In a multilayer substrate according to a preferred embodiment of the present invention, the first thermoplastic resin layer of the first laminate portion and the second thermoplastic resin layer of the second laminate portion may be made of the same thermoplastic resin. For example, each of the first thermoplastic resin layer and the second thermoplastic resin layer may include a liquid crystal polymer as a main component. In this case, the molecular weight of the liquid crystal polymer of the first thermoplastic resin layer and the molecular weight of the liquid crystal polymer of the second thermoplastic resin layer are preferably different from each other.

The resin multilayer body 10 includes a first main surface 10a on the first laminate portion 11 side and a second main surface 10b on the second laminate portion 12 side, which face each other in the lamination direction. More particularly, the first main surface 10a of the resin multilayer body 10 corresponds to a surface of the first thermoplastic resin layer 11a on a side opposite to the second thermoplastic resin layer 12a. In addition, the second main surface 10b of the resin multilayer body 10 corresponds to a surface of the second thermoplastic resin layer 12a on a side opposite to the first thermoplastic resin layer 11a.

The surface electrode 20a is provided on the first main surface 10a of the resin multilayer body 10.

The surface electrode 20b is provided on the first main surface 10a of the resin multilayer body 10 at a position spaced from the surface electrode 20a.

Examples of the material of the surface electrode 20a and the surface electrode 20b include copper, silver, aluminum, stainless steel, nickel, gold, alloys including at least one of these metals, and the like.

Each of the surface electrode 20a and the surface electrode 20b preferably includes copper, for example.

The surface electrode 20a and the surface electrode 20b are each preferably made of conductive foils, and particularly preferably made of copper foils among the conductive foils, for example.

The materials of the surface electrode 20a and the surface electrode 20b are preferably the same as each other, but may be different from each other.

The first conductor pattern 30 is provided between the first laminate portion 11 and the second laminate portion 12. The first conductor pattern 30 is preferably provided across the boundary between the first thermoplastic resin layer 11a and the second thermoplastic resin layer 12a. As a result, the interface between the first conductor pattern 30 and the first thermoplastic resin layer 11a and the interface between the first conductor pattern 30 and the second thermoplastic resin layer 12a are deviated from the interface between the first thermoplastic resin layer 11a and the second thermoplastic resin layer 12a in the lamination direction, so that peeling at the interface between the first conductor pattern 30 and the first thermoplastic resin layer 11a and peeling at the interface between the first conductor pattern 30 and the second thermoplastic resin layer 12a are reduced or prevented.

The boundary between the first thermoplastic resin layer 11a and the second thermoplastic resin layer 12a can be determined by observing the cross section along the lamination direction as illustrated in FIG. 2 and FIG. 3 by infrared spectrometry or observing the position of an end portion of each of the interlayer connection conductors.

One surface of the first conductor pattern 30 on the side of the surface electrode 20a and the surface electrode 20b in the lamination direction is connected to the first interlayer connection conductor 41a and the first interlayer connection conductor 41b. On the other hand, the other surface of the first conductor pattern 30 on the side opposite to the surface electrode 20a and the surface electrode 20b in the lamination direction is not connected to the interlayer connection conductor.

Examples of the material of the first conductor pattern 30 include copper, silver, aluminum, stainless steel, nickel, gold, an alloy including at least one of these metals, and the like.

The first conductor pattern 30 preferably includes, for example, copper.

The first conductor pattern 30 is preferably made of a conductive foil, and particularly preferably made of a copper foil among the conductive foils, for example.

The first interlayer connection conductor 41a extends through the first thermoplastic resin layer 11a in the lamination direction. Thus, the first interlayer connection conductor 41a electrically connects the surface electrode 20a and the first conductor pattern 30.

The first interlayer connection conductor 41b extends through the first thermoplastic resin layer 11a in the lamination direction at a position spaced from the first interlayer connection conductor 41a. Thus, the first interlayer connection conductor 41b electrically connects the surface electrode 20b and the first conductor pattern 30.

In a transmission direction orthogonal or substantially orthogonal to the lamination direction, more specifically, in a direction in which the first interlayer connection conductor 41a and the first interlayer connection conductor 41b face each other, the lengths of the first interlayer connection conductor 41a and the first interlayer connection conductor 41b are each smaller than the length of the first conductor pattern 30.

The first interlayer connection conductor 41a and the first interlayer connection conductor 41b each include, for example, resins and at least one kind of metallic element. The first interlayer connection conductor 41a and the first interlayer connection conductor 41b are each a sintered body of a conductive paste, for example, by filling via holes provided so as to extend through the first thermoplastic resin layer 11a with the conductive paste and then performing heat treatment.

The resins included in the first interlayer connection conductor 41a and the first interlayer connection conductor 41b preferably include, for example, at least one thermosetting resin selected from epoxy resins, phenol resins, polyimide resins, silicone resins or modified resins thereof, or acrylic resins, or at least one thermoplastic resin of polyamide resins, polystyrene resins, polymethacrylic resins, polycarbonate resins, and cellulose-based resins.

Examples of the metallic elements included in the first interlayer connection conductor 41a and the first interlayer connection conductor 41b include copper, tin, silver, and the like.

Each of the first interlayer connection conductor 41a and the first interlayer connection conductor 41b preferably includes copper as a metallic element, and more preferably includes copper and tin as metallic elements, for example.

The first interlayer connection conductor 41a preferably includes, for example, tin as a metallic element having the minimum melting point among the melting points of the metallic elements included in the first interlayer connection conductor 41a.

The first interlayer connection conductor 41b preferably includes, for example, tin as a metallic element having the minimum melting point among the melting points of the metallic elements included in the first interlayer connection conductor 41b.

The resins included in the first interlayer connection conductor 41a and the first interlayer connection conductor 41b are preferably the same as each other, but may be different from each other. In addition, the metallic elements included in the first interlayer connection conductor 41a and the first interlayer connection conductor 41b are preferably the same as each other, but may be different from each other. In other words, it is preferable that the first interlayer connection conductor 41a and the first interlayer connection conductor 41b include the same resins and the same metallic elements as each other.

As illustrated in FIG. 1, FIG. 2, and FIG. 3, the multilayer substrate 1 may further include a second conductor pattern 50 for grounding.

The second conductor pattern 50 is provided on the second main surface 10b side of the resin multilayer body 10 with respect to the first conductor pattern 30. To be more specific, the second conductor pattern 50 is provided on the second main surface 10b of the resin multilayer body 10. The second conductor pattern 50 may be provided not on the second main surface 10b of the resin multilayer body 10 but inside the resin multilayer body 10.

The second conductor pattern 50 overlaps the first conductor pattern 30 when viewed from the lamination direction.

Examples of the material of the second conductor pattern 50 include copper, silver, aluminum, stainless steel, nickel, gold, an alloy including at least one of these metals, and the like.

The second conductor pattern 50 preferably includes, for example, copper.

The second conductor pattern 50 is preferably made of a conductive foil, and particularly preferably made of a copper foil among the conductive foils, for example.

As illustrated in FIG. 1 and FIG. 2, the multilayer substrate 1 may further include a second interlayer connection conductor 42a, a second interlayer connection conductor 42b, a second interlayer connection conductor 42c, and a second interlayer connection conductor 42d.

The second interlayer connection conductor 42a and the second interlayer connection conductor 42b extend through the second thermoplastic resin layer 12a in the lamination direction at positions sandwiching the first interlayer connection conductor 41a when viewed from the lamination direction. Thus, the second interlayer connection conductor 42a and the second interlayer connection conductor 42b are connected to the second conductor pattern 50.

The second interlayer connection conductor 42c and the second interlayer connection conductor 42d extend through the second thermoplastic resin layer 12a in the lamination direction at positions sandwiching the first interlayer connection conductor 41b when viewed from the lamination direction. Thus, the second interlayer connection conductor 42c and the second interlayer connection conductor 42d are connected to the second conductor pattern 50.

It is preferable that the second interlayer connection conductor 42a, the second interlayer connection conductor 42b, the second interlayer connection conductor 42c, and the second interlayer connection conductor 42d each include resins and at least one kind of metallic element, for example. In this case, the second interlayer connection conductor 42a, the second interlayer connection conductor 42b, the second interlayer connection conductor 42c, and the second interlayer connection conductor 42d are each provided as a sintered body of a conductive paste, for example, by filling the via holes provided so as to extend through the second thermoplastic resin layer 12a with the conductive paste and then performing heat treatment.

The resins included in the second interlayer connection conductor 42a, the second interlayer connection conductor 42b, the second interlayer connection conductor 42c, and the second interlayer connection conductor 42d preferably include at least one thermosetting resin of, for example, epoxy resins, phenol resins, polyimide resins, silicone resins or modified resins thereof, and acrylic resins, or at least one thermoplastic resin of, for example, polyamide resins, polystyrene resins, polymethacrylic resins, polycarbonate resins, and cellulosic resins.

Examples of the metallic elements included in the second interlayer connection conductor 42a, the second interlayer connection conductor 42b, the second interlayer connection conductor 42c, and the second interlayer connection conductor 42d include copper, tin, silver, and the like.

Each of the second interlayer connection conductor 42a, the second interlayer connection conductor 42b, the second interlayer connection conductor 42c, and the second interlayer connection conductor 42d preferably each copper as a metallic element, and more preferably includes copper and tin as metallic elements, for example.

The resins included in the second interlayer connection conductor 42a, the second interlayer connection conductor 42b, the second interlayer connection conductor 42c, and the second interlayer connection conductor 42d are preferably the same as each other, but may be different from each other. In addition, the metallic elements included in the second interlayer connection conductor 42a, the second interlayer connection conductor 42b, the second interlayer connection conductor 42c, and the second interlayer connection conductor 42d are preferably the same as each other, but may be different from each other. In other words, it is preferable that the second interlayer connection conductor 42a, the second interlayer connection conductor 42b, the second interlayer connection conductor 42c, and the second interlayer connection conductor 42d each include the same resins and the same metallic elements.

As illustrated in FIG. 1, FIG. 2, and FIG. 3, the multilayer substrate 1 may further include a ground electrode 60.

The ground electrode 60 is provided on the first main surface 10a of the resin multilayer body 10 at a position spaced apart from the surface electrode 20a and the surface electrode 20b.

Examples of the material of the ground electrode 60 include copper, silver, aluminum, stainless steel, nickel, gold, an alloy including at least one of these metals, and the like.

The ground electrode 60 preferably includes, for example, copper.

The ground electrode 60 is preferably made of a conductive foil, and particularly preferably made of a copper foil among conductive foils, for example.

As illustrated in FIG. 1 and FIG. 2, the multilayer substrate 1 may further include a third interlayer connection conductor 43a, a third interlayer connection conductor 43b, a third interlayer connection conductor 43c, and a third interlayer connection conductor 43d.

The third interlayer connection conductor 43a and the third interlayer connection conductor 43b extend through the first thermoplastic resin layer 11a in the lamination direction at positions sandwiching the first interlayer connection conductor 41a when viewed from the lamination direction. Thus, the third interlayer connection conductor 43a and the third interlayer connection conductor 43b are connected to the ground electrode 60.

The third interlayer connection conductor 43c and the third interlayer connection conductor 43d extend through the first thermoplastic resin layer 11a in the lamination direction at positions sandwiching the first interlayer connection conductor 41b when viewed from the lamination direction.

Thus, the third interlayer connection conductor 43c and the third interlayer connection conductor 43d are connected to the ground electrode 60.

It is preferable that the third interlayer connection conductor 43a, the third interlayer connection conductor 43b, the third interlayer connection conductor 43c, and the third interlayer connection conductor 43d each include, for example, resins and at least one kind of metallic element. In this case, the third interlayer connection conductor 43a, the third interlayer connection conductor 43b, the third interlayer connection conductor 43c, and the third interlayer connection conductor 43d are each provided as a sintered body of a conductive paste, for example, by filling the via holes provided so as to extend through the first thermoplastic resin layer 11a with the conductive paste, and then performing heat treatment.

The resins included in the third interlayer connection conductor 43a, the third interlayer connection conductor 43b, the third interlayer connection conductor 43c, and the third interlayer connection conductor 43d preferably include, for example, at least one thermosetting resin of epoxy resins, phenolic resins, polyimide resins, silicone resins or modified resins thereof, and acrylic resins, or at least one thermoplastic resin of, for example, polyamide resins, polystyrene resins, polymethacrylic resins, polycarbonate resins, and cellulosic resins.

Examples of the metallic elements included in the third interlayer connection conductor 43a, the third interlayer connection conductor 43b, the third interlayer connection conductor 43c, and the third interlayer connection conductor 43d include copper, tin, and silver.

Each of the third interlayer connection conductor 43a, the third interlayer connection conductor 43b, the third interlayer connection conductor 43c, and the third interlayer connection conductor 43d preferably includes copper as a metallic element, and more preferably includes copper and tin as metallic elements, for example.

The resins included in the third interlayer connection conductor 43a, the third interlayer connection conductor 43b, the third interlayer connection conductor 43c, and the third interlayer connection conductor 43d are preferably the same as each other, but may be different from each other. In addition, the metallic elements included in the third interlayer connection conductor 43a, the third interlayer connection conductor 43b, the third interlayer connection conductor 43c, and the third interlayer connection conductor 43d are preferably the same as each other, but may be different from each other. In other words, it is preferable that the third interlayer connection conductor 43a, the third interlayer connection conductor 43b, the third interlayer connection conductor 43c, and the third interlayer connection conductor 43d include the same resins and the same metallic elements as each other.

As illustrated in FIG. 1 and FIG. 2, the multilayer substrate 1 may further include a connection conductor layer 70a, a connection conductor layer 70b, a connection conductor layer 70c, and a connection conductor layer 70d.

The connection conductor layer 70a, the connection conductor layer 70b, the connection conductor layer 70c, and the connection conductor layer 70d are each provided at positions spaced apart from each other between the first laminate portion 11 and the second laminate portion 12. It is preferable that the connection conductor layer 70a, the connection conductor layer 70b, the connection conductor layer 70c, and the connection conductor layer 70d are each provided at positions spaced apart from each other across the boundary between the first thermoplastic resin layer 11a and the second thermoplastic resin layer 12a. As a result, the interface between each of the connection conductor layers and the first thermoplastic resin layer 11a and the interface between each of the connection conductor layers and the second thermoplastic resin layer 12a are deviated from the interface between the first thermoplastic resin layer 11a and the second thermoplastic resin layer 12a in the lamination direction, so that peeling at the interface between each of the connection conductor layers and the first thermoplastic resin layer 11a and peeling at the interface between each of the connection conductor layers and the second thermoplastic resin layer 12a are reduced or prevented.

The connection conductor layer 70a electrically connects the second interlayer connection conductor 42a and the third interlayer connection conductor 43a.

The connection conductor layer 70b electrically connects the second interlayer connection conductor 42b and the third interlayer connection conductor 43b.

The connection conductor layer 70c electrically connects the second interlayer connection conductor 42c and the third interlayer connection conductor 43c.

The connection conductor layer 70d electrically connects the second interlayer connection conductor 42d and the third interlayer connection conductor 43d.

In the transmission direction orthogonal or substantially orthogonal to the lamination direction, the lengths of the connection conductor layer 70a, the connection conductor layer 70b, the connection conductor layer 70c, and the connection conductor layer 70d are each smaller than the length of the first conductor pattern 30.

Examples of the material of the connection conductor layer 70a, the connection conductor layer 70b, the connection conductor layer 70c, and the connection conductor layer 70d include copper, silver, aluminum, stainless steel, nickel, gold, alloys including at least one of these metals, and the like.

It is preferable that the connection conductor layer 70a, the connection conductor layer 70b, the connection conductor layer 70c, and the connection conductor layer 70d each include copper, for example.

The connection conductor layer 70a, the connection conductor layer 70b, the connection conductor layer 70c, and the connection conductor layer 70d are each preferably made of conductive foils, and particularly preferably made of copper foils among the conductive foils, for example.

The materials of the connection conductor layer 70a, the connection conductor layer 70b, the connection conductor layer 70c, and the connection conductor layer 70d are preferably the same as each other, but may be different from each other.

In a multilayer substrate according to a preferred embodiment of the present invention, the storage elastic modulus of the first thermoplastic resin layer is lower than the storage elastic modulus of the second thermoplastic resin layer at a measurement temperature equal to or higher than the minimum melting point among the melting points of the metallic elements included in the first interlayer connection conductor and equal to or lower than the melting points of the first thermoplastic resin layer and the second thermoplastic resin layer (hereinafter simply referred to as a measurement temperature).

Regarding the above measurement temperature, the temperature equal to or lower than the melting points of the first thermoplastic resin layer and the second thermoplastic resin layer means a temperature equal to or lower than the lower melting point of the melting point of the first thermoplastic resin layer and the melting point of the second thermoplastic resin layer. The melting point of the first thermoplastic resin layer and the melting point of the second thermoplastic resin layer may be the same as or different from each other.

The temperature dependence of the storage elastic modulus of the thermoplastic resin layer is measured by dynamic measurement analysis (DMA).

In the multilayer substrate 1, the storage elastic modulus of the first thermoplastic resin layer 11a is lower than the storage elastic modulus of the second thermoplastic resin layer 12a at a measurement temperature equal to or higher than the minimum melting point among the melting points of the metallic elements included in the first interlayer connection conductor 41a and the first interlayer connection conductor 41b and equal to or lower than the melting points of the first thermoplastic resin layer 11a and the second thermoplastic resin layer 12a.

The operation and advantageous effects of the multilayer substrate 1 in which the storage elastic modulus of the first thermoplastic resin layer 11a is lower than the storage elastic modulus of the second thermoplastic resin layer 12a at the above measurement temperature will be described below with reference to an example of a non-limiting example of a method for manufacturing the multilayer substrate 1 according to a preferred embodiment of the present invention. Hereinafter, the non-limiting example of a method for manufacturing the multilayer substrate 1 illustrated in FIG. 1 will be described with reference to the process of forming the cross section illustrated in FIG. 2, but the same applies to the process of forming another cross section, for example, the cross section illustrated in FIG. 3.

Conductor Layer Forming Step on One Surface of First Thermoplastic Resin Sheet

Figure 4:
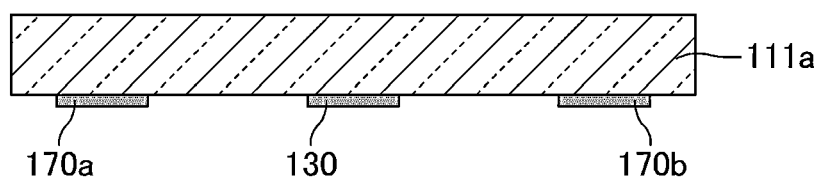
FIG. 4 is a schematic cross-sectional view illustrating an example of a step of forming a conductor layer on one surface of a first thermoplastic resin sheet in a method for manufacturing the multilayer substrate according to Preferred Embodiment 1 of the present invention.

FIG. 4 is a schematic cross-sectional view illustrating an example of a step of forming a conductor layer on one surface of a first thermoplastic resin sheet in the method for manufacturing the multilayer substrate according to Preferred Embodiment 1 of the present invention.

As illustrated in FIG. 4, a conductor layer 130, a conductor layer 170a and a conductor layer 170b are formed on one surface of a first thermoplastic resin sheet 111a. The first thermoplastic resin sheet 111a becomes the first thermoplastic resin layer 11a. The conductor layer 130, the conductor layer 170a, and the conductor layer 170b become the first conductor pattern 30, the connection conductor layer 70a, and the connection conductor layer 70b, respectively.

Although not illustrated in FIG. 4, in this step, a conductor layer to become the connection conductor layer 70c and a conductor layer to become the connection conductor layer 70d are further formed on one surface of the first thermoplastic resin sheet 111a.

Examples of the method for forming the conductor layer on the one surface of the first thermoplastic resin sheet 111a include a method for etching conductive foils attached to the one surface of the first thermoplastic resin sheet 111a, a method for transferring conductive foils formed in patterns of the conductor layers to the one surface of the first thermoplastic resin sheet 111a, and the like.

As the first thermoplastic resin sheet 111a, a thermoplastic resin sheet having a storage elastic modulus lower than that of the second thermoplastic resin sheet 112a at a temperature equal to or higher than the minimum melting point among the melting points of metallic elements included in a conductive paste 190 described later and equal to or lower than the melting points of the first thermoplastic resin sheet 111a and a second thermoplastic resin sheet 112a described later is used. As a result, in the multilayer substrate 1 to be obtained later, the storage elastic modulus of the first thermoplastic resin layer 11a is lower than the storage elastic modulus of the second thermoplastic resin layer 12a at the above measurement temperature.

Examples of the thermoplastic resin forming the first thermoplastic resin sheet 111a include liquid crystal polymers, fluorine resin, thermoplastic polyimide resins, polyetheretherketone resins, polyphenylene sulfide resins, and the like.

The first thermoplastic resin sheet 111a may include a liquid crystal polymer as a main component. In this case, by changing the molecular weight of the liquid crystal polymer, the storage elastic modulus of the first thermoplastic resin sheet 111a can be adjusted, and the storage elastic modulus of the first thermoplastic resin sheet 111a can be made lower than the storage elastic modulus of the second thermoplastic resin sheet 112a as described later.

The thickness of the first thermoplastic resin sheet 111a is, for example, equal to or more than about 10 μm and equal to or less than about 2000 μm.

Examples of the material of the conductive foil include copper, silver, aluminum, stainless steel, nickel, gold, an alloy including at least one of these metals, and the like.

The conductive foil preferably includes copper. That is, each conductor layer is preferably formed using a copper foil.

The thickness of the conductive foil is equal to or more than about 3 μm and equal to or less than about 40 μm, for example. The thicknesses of the conductive foils used for forming the conductor layers are preferably the same as each other, but may be different from each other.

Via Hole Forming Step in First Thermoplastic Resin Sheet

Figure 5:
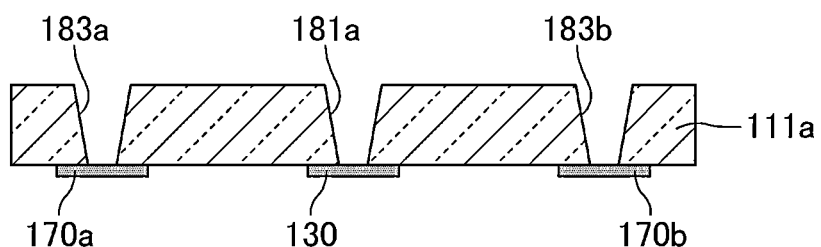
FIG. 5 is a schematic cross-sectional view illustrating an example of a step of forming a via hole in the first thermoplastic resin sheet in the method for manufacturing the multilayer substrate according to Preferred Embodiment 1 of the present invention.

FIG. 5 is a schematic cross-sectional view illustrating an example of a step of forming a via hole in the first thermoplastic resin sheet in the method for manufacturing the multilayer substrate according to Preferred Embodiment 1 of the present invention.

As illustrated in FIG. 5, a via hole 181a, a via hole 183a, and a via hole 183b each passing through the first thermoplastic resin sheet 111a are formed. Thus, the conductor layer 130, the conductor layer 170a, and the conductor layer 170b are partially exposed.

Although not illustrated in FIG. 5, in this step, a via hole for exposing another portion of the conductor layer 130, a via hole for exposing a portion of the conductor layer to become the connection conductor layer 70c, and a via hole for exposing a portion of the conductor layer to become the connection conductor layer 70d are further formed so as to each extend through the first thermoplastic resin sheet 111a.

Examples of the method for forming the via holes in the first thermoplastic resin sheet 111a include methods, such as a method for performing laser irradiation from the other surface side facing the one surface of the first thermoplastic resin sheet 111a. Such laser irradiation is performed by, for example, a pulse oscillation type carbon dioxide laser irradiation device. After the laser irradiation, for example, a desmear treatment such as an oxygen plasma discharge treatment or a corona discharge treatment is preferably performed in order to remove resin residues. Removal of the resin residue may be performed by potassium permanganate treatment or the like.

As illustrated in FIG. 5, each via hole preferably has a tapered shape with a diameter decreasing toward each conductor layer formed on one surface of the first thermoplastic resin sheet 111a.

Figure 6:
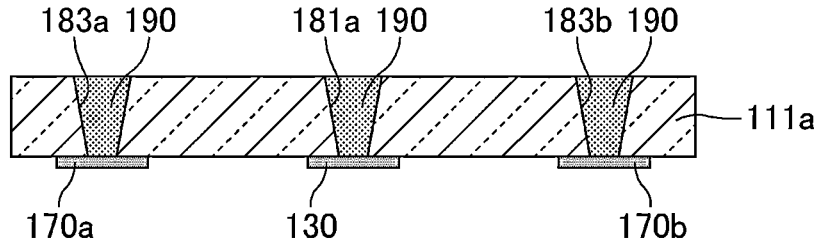
FIG. 6 is a schematic cross-sectional view illustrating an example of a step of filling a via hole of the first thermoplastic resin sheet with a conductive paste in the method for manufacturing the multilayer substrate according to Preferred Embodiment 1 of the present invention.

Step of Filling Via Holes of First Thermoplastic Resin Sheet with Conductive Paste FIG. 6 is a schematic cross-sectional view illustrating an example of a step of filling a via hole of the first thermoplastic resin sheet with a conductive paste in the method for manufacturing the multilayer substrate according to Preferred Embodiment 1 of the present invention.

As illustrated in FIG. 6, each of the via hole 181a, the via hole 183a, and the via hole 183b is filled with the conductive paste 190.

Although not illustrated in FIG. 6, in this step, as described above, the via hole for exposing another portion of the conductor layer 130, the via hole for exposing a portion of the conductor layer to become the connection conductor layer 70c, and the via hole for exposing a portion of the conductor layer to become the connection conductor layer 70d are each also filled with the conductive paste 190.

The conductive paste 190 with which the first thermoplastic resin sheet 111a is filled is to define and function as the first interlayer connection conductor such as the first interlayer connection conductor 41a and the third interlayer connection conductor such as the third interlayer connection conductor 43a.

Examples of a method for filling the via holes formed in the first thermoplastic resin sheet 111a with the conductive paste 190 include a screen-printing method, a vacuum filling method, and the like.

The conductive paste 190 includes, for example, a resin and at least one kind of metallic element.

The resin included in the conductive paste 190 preferably includes, for example, at least one thermosetting resin selected from the group consisting of an epoxy resin, a phenol resin, a polyimide resin, a silicon resin or a modified resin thereof, and an acrylic resin, or at least one thermoplastic resin selected from the group consisting of a polyamide resin, a polystyrene resin, a polymethacrylic resin, a polycarbonate resin, and a cellulose-based resin.

Examples of the metallic element included in the conductive paste 190 include copper, tin, silver, and the like.

The conductive paste 190 preferably includes copper as a metallic element, and more preferably includes copper and tin as metallic elements.

The conductive paste 190 preferably includes, for example, tin as a metallic element having the minimum melting point among the melting points of the metallic elements included in the conductive paste 190.

The conductive paste 190 may further include, for example, a vehicle, a solvent, a thixotropic agent, an activator, and the like.

Examples of the vehicle include a rosin-based resin composed of rosin and a derivative such as a modified rosin obtained by modifying the rosin, a synthetic resin including rosin and a derivative such as a modified rosin obtained by modifying the rosin, a mixture of these resins, and the like.

Examples of rosin-based resins including rosin and derivatives thereof such as modified rosin obtained by modifying rosin include gum rosin, tall rosin, wood rosin, polymerized rosin, hydrogenated rosin, formylated rosin, rosin ester, rosin-modified maleic acid resins, rosin-modified phenol resins, rosin-modified alkyd resins, other various rosin derivatives, and the like.

Examples of synthetic resins including rosin and derivatives thereof such as modified rosin obtained by modifying rosin include polyester resins, polyamide resins, phenoxy resins, terpene resins, and the like.

Examples of the solvent include alcohols, ketones, esters, ethers, aromatic compounds, hydrocarbons, and the like.

Specific examples thereof include benzyl alcohol, ethanol, isopropyl alcohol, butanol, diethylene glycol, ethylene glycol, glycerin, ethyl cellosolve, butyl cellosolve, ethyl acetate, butyl acetate, butyl benzoate, diethyl adipate, dodecane, tetradecene, α-terpineol, terpineol, 2-methyl-2,4-pentanediol, 2-ethylhexanediol, toluene, xylene, propylene glycol monophenyl ether, diethylene glycol monohexyl ether, ethylene glycol monobutyl ether, diethylene glycol monobutyl ether, diethylene glycol monoethyl ether, diisobutyl adipate, hexylene glycol, cyclohexanedimethanol, 2-terpinyl oxyethanol, 2-dihydroterpinyl oxyethanol, mixtures thereof, and the like. Among them, terpineol, ethylene glycol monobutyl ether, diethylene glycol monobutyl ether, or diethylene glycol monoethyl ether is preferable.

Examples of the thixotropic agent include hydrogenated castor oil, carnauba wax, amides, hydroxy fatty acids, dibenzylidene sorbitol, bis (p-methylbenzylidene) sorbitols, beeswax, stearic acid amide, hydroxystearic acid ethylene bisamide, and the like. In addition, when necessary, fatty acids such as, for example, caprylic acid, lauric acid, myristic acid, palmitic acid, stearic acid, and behenic acid, hydroxy fatty acids such as 1,2-hydroxystearic acid, antioxidants, surfactants, amines, and the like may be added to these thixotropic agents.

Examples of the activator include amine hydrogen halide salt, organic halogen compounds, organic acids, organic amines, polyhydric alcohols, and the like.

Examples of the amine hydrogen halide salt include diphenylguanidine hydrobromide, diphenylguanidine hydrochloride, cyclohexylamine hydrobromide, ethylamine hydrochloride, ethylamine hydrobromide, diethylaniline hydrobromide, diethylaniline hydrochloride, triethanolamine hydrobromide, monoethanolamine hydrobromide, and the like.

Examples of the organic halogen compounds include chlorinated paraffin, tetrabromoethane, dibromopropanol, 2,3-dibromo-1,4-butanediol, 2,3-dibromo-2-butene-1,4-diol, tris (2,3-dibromopropyl) isocyanurate, and the like.

Examples of the organic acids include malonic acid, fumaric acid, glycolic acid, citric acid, malic acid, succinic acid, phenylsuccinic acid, maleic acid, salicylic acid, anthranilic acid, glutaric acid, suberic acid, adipic acid, sebacic acid, stearic acid, abietic acid, benzoic acid, trimellitic acid, pyromellitic acid, dodecanoic acid, and the like.

Examples of the organic amines include monoethanolamine, diethanolamine, triethanolamine, tributylamine, aniline, diethylaniline, and the like.

Examples of the polyhydric alcohols include erythritol, pyrogallol, ribitol, and the like.

Figure 7:
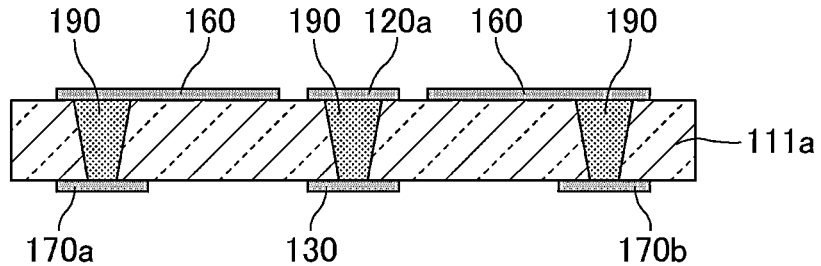
FIG. 7 is a schematic cross-sectional view illustrating an example of a step of forming a conductor layer on the other surface of the first thermoplastic resin sheet in the method for manufacturing the multilayer substrate according to Preferred Embodiment 1 of the present invention.

Conductor Layer Forming Step on Other Surface of First Thermoplastic Resin Sheet FIG. 7 is a schematic cross-sectional view illustrating an example of a step of forming a conductor layer on the other surface of the first thermoplastic resin sheet in the method for manufacturing the multilayer substrate according to Preferred Embodiment 1 of the present invention.

As illustrated in FIG. 7, a conductor layer 120a and a conductor layer 160 are formed on the other surface of the first thermoplastic resin sheet 111a. The conductor layer 120a and the conductor layer 160 are to become the surface electrode 20a and the ground electrode 60, respectively.

Although not illustrated in FIG. 7, in this step, a conductor layer to become the surface electrode 20b is further formed on the other surface of the first thermoplastic resin sheet 111a.

Examples of the method for forming the conductor layers on the other surface of the first thermoplastic resin sheet 111a include a method for etching the conductive foil attached to the other surface of the first thermoplastic resin sheet 111a, a method for transferring conductive foils formed in patterns of the conductor layers to the other surface of the first thermoplastic resin sheet 111a, and the like. As such a conductive foil, it is preferable to use the same one as the conductive foil described in the step of forming a conductor layer on one surface of the first thermoplastic resin sheet.

As described above, the first thermoplastic resin sheet 111a filled with the conductive paste 190 and including the conductor layers formed on the one surface and the other surface thereof is produced.

Conductor Layer Forming Step on One Surface of Second Thermoplastic Resin Sheet

FIG. 8 is a schematic cross-sectional view illustrating an example of a step of forming a conductor layer on one surface of a second thermoplastic resin sheet in the method for manufacturing the multilayer substrate according to Preferred Embodiment 1 of the present invention.

As illustrated in FIG. 8, a conductor layer 150 is formed on one surface of the second thermoplastic resin sheet 112a. The second thermoplastic resin sheet 112a is to become the second thermoplastic resin layer 12a. The conductor layer 150 is to become the second conductor pattern 50.

Examples of the method of forming the conductor layer 150 on the one surface of the second thermoplastic resin sheet 112a include a method for etching the conductive foil attached to the one surface of the second thermoplastic resin sheet 112a and a method for transferring the conductive foil formed in the pattern of the conductor layer 150 to the one surface of the second thermoplastic resin sheet 112a. As such a conductive foil, it is preferable to use the same one as the conductive foil described in the step of forming a conductor layer on one surface of the first thermoplastic resin sheet.

As the second thermoplastic resin sheet 112a, a thermoplastic resin sheet having a storage elastic modulus higher than that of the first thermoplastic resin sheet 111a at a temperature equal to or higher than the minimum melting point among the melting points of the metallic elements included in the conductive paste 190 and equal to or lower than the melting points of the first thermoplastic resin sheet 111a and the second thermoplastic resin sheet 112a is used. As a result, in the multilayer substrate 1 to be obtained later, the storage elastic modulus of the first thermoplastic resin layer 11a is lower than the storage elastic modulus of the second thermoplastic resin layer 12a at the above measurement temperature.

Examples of the thermoplastic resin forming the second thermoplastic resin sheet 112a include liquid crystal polymers, fluorine resin, thermoplastic polyimide resins, polyetheretherketone resins, polyphenylene sulfide resins, and the like.

The second thermoplastic resin sheet 112a may contain a liquid crystal polymer as a main component. In this case, by changing the molecular weight of the liquid crystal polymer, the storage elastic modulus of the second thermoplastic resin sheet 112a can be adjusted, and as described above, the storage elastic modulus of the second thermoplastic resin sheet 112a can be made higher than the storage elastic modulus of the first thermoplastic resin sheet 111a.

The thickness of the second thermoplastic resin sheet 112a is, for example, equal to or more than about 10 µm and equal to or less than about 2000 µm.

Via Hole Forming Step in Second Thermoplastic Resin Sheet

FIG. 9 is a schematic cross-sectional view illustrating an example of a step of forming a via hole in the second thermoplastic resin sheet in the method for manufacturing the multilayer substrate according to Preferred Embodiment 1 of the present invention.

As illustrated in FIG. 9, a via hole 182a and a via hole 182b each passing through the second thermoplastic resin sheet 112a are formed. Thus, a portion and another portion of the conductor layer 150 are exposed.

Although not illustrated in FIG. 9, in this step, a via hole for exposing still another portion of the conductor layer 150 and a via hole for exposing further still another portion of the conductor layer 150 are further formed so as to respectively extend through the second thermoplastic resin sheet 112a.

Examples of the method for forming the via holes in the second thermoplastic resin sheet 112a include a method for performing laser irradiation from the other surface side facing the one surface of the second thermoplastic resin sheet 112a. Such laser irradiation is performed by, for example, a pulse oscillation type carbon dioxide laser irradiation device. After the laser irradiation, for example, a desmear treatment such as an oxygen plasma discharge treatment or a corona discharge treatment is preferably performed in order to remove resin residues. Removal of the resin residue may be performed by, for example, potassium permanganate treatment or the like.

As illustrated in FIG. 9, each via hole preferably has a tapered shape with a diameter decreasing toward the conductor layer 150 formed on one surface of the second thermoplastic resin sheet 112a.

Step of Filling Via Holes of Second Thermoplastic Resin Sheet with Conductive Paste FIG. 10 is a schematic cross-sectional view illustrating an example of a step of filling a via hole of the second thermoplastic resin sheet with a conductive paste in the method for manufacturing a multilayer substrate according to Preferred Embodiment 1 of the present invention.

As illustrated in FIG. 10, each of the via hole 182a and the via hole 182b is filled with the conductive paste 190.

Although not illustrated in FIG. 10, in this step, as described above, the via hole for exposing still another portion of the conductor layer 150 and the via hole for exposing further still another portion of the conductor layer 150 are each also filled with the conductive paste 190.

The conductive paste 190 with which the second thermoplastic resin sheet 112a is filled is to define and function as the second interlayer connection conductor such as the second interlayer connection conductor 42a.

Examples of a method for filling the via holes formed in the second thermoplastic resin sheet 112a with the conductive paste 190 include a screen-printing method, a vacuum filling method, and the like.

As described above, the second thermoplastic resin sheet 112a filled with the conductive paste 190 and including the conductor layer 150 formed on one surface thereof is produced.

The production of the first thermoplastic resin sheet 111a filled with the conductive paste 190 and having the conductor layers formed on the one surface and the other surface and the production of the second thermoplastic resin sheet 112a filled with the conductive paste 190 and including the conductor layer 150 formed on the one surface may be performed at the same timing or at different timings.

Laminating and Thermal Pressure Bonding Step of First Thermoplastic Resin Sheet and Second Thermoplastic Resin Sheet FIG. 11 and FIG. 12 are schematic cross-sectional views illustrating an example of a step of laminating and thermal pressure bonding the first thermoplastic resin sheet and the second thermoplastic resin sheet in the method for manufacturing the multilayer substrate according to Preferred Embodiment 1 of the present invention.

First, as illustrated in FIG. 11, the first thermoplastic resin sheet 111a filled with the conductive paste 190 and including the conductor layers formed on one surface and the other surface and the second thermoplastic resin sheet 112a filled with the conductive paste 190 and including the conductor layer 150 formed on one surface are laminate in the lamination direction so that the one surface of the first thermoplastic resin sheet 111a and the other surface of the second thermoplastic resin sheet 112a are in contact with each other.

In the multilayer body of the first thermoplastic resin sheet 111a and the second thermoplastic resin sheet 112a, although the conductor layer 130 is in contact with both the first thermoplastic resin sheet 111a and the second thermoplastic resin sheet 112a, the contact area between the conductor layer 130 and the second thermoplastic resin sheet 112a is larger than the contact area between the conductor layer 130 and the first thermoplastic resin sheet 111a due to the fact that one surface of the conductor layer 130 is exposed from the via hole formed in the first thermoplastic resin sheet 111a.

Next, the multilayer body of the first thermoplastic resin sheet 111a and the second thermoplastic resin sheet 112a is heated to a temperature equal to or higher than the minimum melting point among the melting points of the metallic elements included in the conductive paste 190 and equal to or lower than the melting points of the first thermoplastic resin sheet 111a and the second thermoplastic resin sheet 112a. As a result, the conductive paste 190 is fluidized.

In this state, pressure is applied to the multilayer body of the first thermoplastic resin sheet 111a and the second thermoplastic resin sheet 112a in the lamination direction, thus thermally pressure bonding the first thermoplastic resin sheet 111a and the second thermoplastic resin sheet 112a. As a result, the first thermoplastic resin sheet 111a and the second thermoplastic resin sheet 112a become the first thermoplastic resin layer 11a and the second thermoplastic resin layer 12a, respectively. Since the first thermoplastic resin sheet 111a and the second thermoplastic resin sheet 112a are made of thermoplastic resin, the first thermoplastic resin layer 11a and the second thermoplastic resin layer 12a are bonded to each other by thermal pressure bonding.

Since the storage elastic modulus of the first thermoplastic resin sheet 111a at the above temperature is lower than that of the second thermoplastic resin sheet 112a, the pressure applied in the lamination direction at the time of thermal pressure bonding is easily converted into the pressure in a direction orthogonal to the lamination direction as illustrated by arrows in FIG. 12. As a result, as illustrated in FIG. 12, the conductive paste 190 with which the first thermoplastic resin sheet 111a is filled is densified while being deformed by the pressure in the direction orthogonal or substantially orthogonal to the lamination direction. The conductive paste 190 with which the first thermoplastic resin sheet 111a is filled becomes, by sintering in such a state, the first interlayer connection conductor 41a, the first interlayer connection conductor 41b, the third interlayer connection conductor 43a, the third interlayer connection conductor 43b, the third interlayer connection conductor 43c, and the third interlayer connection conductor 43d each having high denseness.

On the other hand, in the second thermoplastic resin sheet 112a, since the storage elastic modulus at the above temperature is higher than that of the first thermoplastic resin sheet 111a, the pressure applied in the lamination direction is less likely to be converted into the pressure in the direction orthogonal or substantially orthogonal to the lamination direction than in the first thermoplastic resin sheet 111a. Therefore, as illustrated in FIG. 12, the conductive paste 190 with which the second thermoplastic resin sheet 112a is filled is less likely to deform than the conductive paste 190 with which the first thermoplastic resin sheet 111a is filled. The conductive paste 190 with which the second thermoplastic resin sheet 112a is filled becomes, by sintering in such a state, the second interlayer connection conductor 42a, the second interlayer connection conductor 42b, the second interlayer connection conductor 42c, and the second interlayer connection conductor 42d.

The conductor layers such as the conductor layer 130 each formed on the one surface of the first thermoplastic resin sheet 111a become the first conductor pattern 30, the connection conductor layer 70a, the connection conductor layer 70b, the connection conductor layer 70c, and the connection conductor layer 70d by this step. At this time, since the conductor layer 130 is in contact with the second thermoplastic resin sheet 112a having a higher storage elastic modulus at the above temperature than the first thermoplastic resin sheet 111a with a large contact area, the conductor layer 130 becomes the first conductor pattern 30 while being less likely to be deformed at the time of thermal pressure bonding and further being less likely to be displaced. As described above, the first conductor pattern 30 is connected to the first interlayer connection conductor 41a and the first interlayer connection conductor 41b each having high denseness while deformation and positional variation thereof are reduced or prevented, so that the connectivity between the first conductor pattern 30 and the first interlayer connection conductor 41a and the connectivity between the first conductor pattern 30 and the first interlayer connection conductor 41b are excellent.

The conductor layers such as the conductor layer 120a formed on the other surface of the first thermoplastic resin sheet 111a become the surface electrode 20a, the surface electrode 20b, and the ground electrode 60 by this step.

The conductor layer 150 formed on the one surface of the second thermoplastic resin sheet 112a becomes the second conductor pattern 50 by this step.

As described above, the multilayer substrate 1 illustrated in FIG. 1, FIG. 2, and FIG. 3 is manufactured.

The first interlayer connection conductor 41a is formed by sintering the conductive paste 190 while being deformed and densified by the pressure in the direction orthogonal or substantially orthogonal to the lamination direction in the manufacturing process of the multilayer substrate 1. Therefore, the first interlayer connection conductor 41a is likely to have a constricted shape as illustrated in FIG. 1, FIG. 2, and FIG. 3. To be more specific, the first interlayer connection conductor 41a is likely to have a shape having a cross-sectional area smaller than each of the cross-sectional area of an end portion on the first conductor pattern 30 side and the cross-sectional area of an end portion on the side opposite to the first conductor pattern 30 in the cross section orthogonal or substantially orthogonal to the lamination direction. As a result, stress applied to the first interlayer connection conductor 41a is relaxed, and thus the connectivity between the first conductor pattern 30 and the first interlayer connection conductor 41a is further improved. In addition, since the first interlayer connection conductor 41a has such a constricted shape, the cross-sectional area of the end portion of the first interlayer connection conductor 41a on the first conductor pattern 30 side is likely to be large, more specifically, the contact area between the first interlayer connection conductor 41a and the first conductor pattern 30 is likely to be large, and thus the connectivity between the first conductor pattern 30 and the first interlayer connection conductor 41a is further improved.

Similarly, the first interlayer connection conductor 41b is formed by sintering the conductive paste 190 while being deformed and densified by the pressure in the direction orthogonal or substantially orthogonal to the lamination direction in the manufacturing process of the multilayer substrate 1. Therefore, the first interlayer connection conductor 41b is likely to have a constricted shape as illustrated in FIG. 1 and FIG. 3. To be more specific, the first interlayer connection conductor 41b is likely to have a shape having a cross-sectional area smaller than each of the cross-sectional area of an end portion on the first conductor pattern 30 side and the cross-sectional area of an end portion on the side opposite to the first conductor pattern 30 in the cross section orthogonal or substantially orthogonal to the lamination direction. As a result, stress applied to the first interlayer connection conductor 41b is relaxed, and thus the connectivity between the first conductor pattern 30 and the first interlayer connection conductor 41b is further improved. In addition, since the first interlayer connection conductor 41b has such a constricted shape, the cross-sectional area of the end portion of the first interlayer connection conductor 41b on the first conductor pattern 30 side is likely to be large, more specifically, the contact area between the first interlayer connection conductor 41b and the first conductor pattern 30 is likely to be large, and thus the connectivity between the first conductor pattern 30 and the first interlayer connection conductor 41b is further improved.

The third interlayer connection conductor 43a, the third interlayer connection conductor 43b, the third interlayer connection conductor 43c, and the third interlayer connection conductor 43d are also likely to have a constricted shape the same as or similar to the first interlayer connection conductor 41a and the first interlayer connection conductor 41b.

The second interlayer connection conductor 42a, the second interlayer connection conductor 42b, the second interlayer connection conductor 42c, and the second interlayer connection conductor 42d each are formed by sintering the conductive paste 190 while being hardly deformed in the manufacturing process of the multilayer substrate 1. That is, each of the second interlayer connection conductor 42a, the second interlayer connection conductor 42b, the second interlayer connection conductor 42c, and the second interlayer connection conductor 42d is likely to have a shape the same as or similar to that of each via hole filled with the conductive paste 190, in this case, a tapered shape. Therefore, in the cross section orthogonal or substantially orthogonal to the lamination direction, the cross-sectional areas of end portions of the second interlayer connection conductor 42a, the second interlayer connection conductor 42b, the second interlayer connection conductor 42c, and the second interlayer connection conductor 42d on the second conductor pattern 50 side are likely to be smaller than the cross-sectional areas of end portions of the first interlayer connection conductor 41a and the first interlayer connection conductor 41b on the first conductor pattern 30 side.

In addition, since the first interlayer connection conductor 41a and the first interlayer connection conductor 41b each have high denseness, a void ratio is likely to be low. To be more specific, the void ratio of the first interlayer connection conductor 41a and the first interlayer connection conductor 41b is likely to be lower than the void ratio of the second interlayer connection conductor 42a, the second interlayer connection conductor 42b, the second interlayer connection conductor 42c, and the second interlayer connection conductor 42d.

The void ratios of the interlayer connection conductors are compared with each other by observing a cross section along the lamination direction as illustrated in FIG. 2 and FIG. 3 with a scanning electron microscope (SEM).

The dielectric loss tangent of the second thermoplastic resin layer 12a is preferably smaller than the dielectric loss tangent of the first thermoplastic resin layer 11a. Here, the first conductor pattern 30 is likely to affect, due to the large length thereof in the transmission direction orthogonal or substantially orthogonal to the lamination direction, loss of electric energy (for example, generation of leakage current). In addition, since the area where the first conductor pattern 30 and the second conductor pattern 50 face each other with the second thermoplastic resin layer 12a interposed therebetween is larger than the area where the first conductor pattern 30 and the ground electrode 60 face each other with the first thermoplastic resin layer 11a interposed therebetween, the loss of the electric energy between the first conductor pattern 30 and the second conductor pattern 50 is likely to be larger. On the other hand, by making the dielectric loss tangent of the second thermoplastic resin layer 12a smaller than the dielectric loss tangent of the first thermoplastic resin layer 11a, the above-described loss of the electric energy can be reduced.

Modification of Preferred Embodiment 1

In the multilayer substrate of Preferred 1 of the present invention, the first thermoplastic resin layer may include a plurality of first thermoplastic resin sublayers. An example of such a multilayer substrate will be described below as a multilayer substrate of a modification of Preferred Embodiment 1 of the present invention. The multilayer substrate of the modification of Preferred Embodiment 1 of the present invention is the same or substantially the same as the multilayer substrate of Preferred Embodiment 1 of the present invention except for the configuration of the first thermoplastic resin layer.

Figure 13:
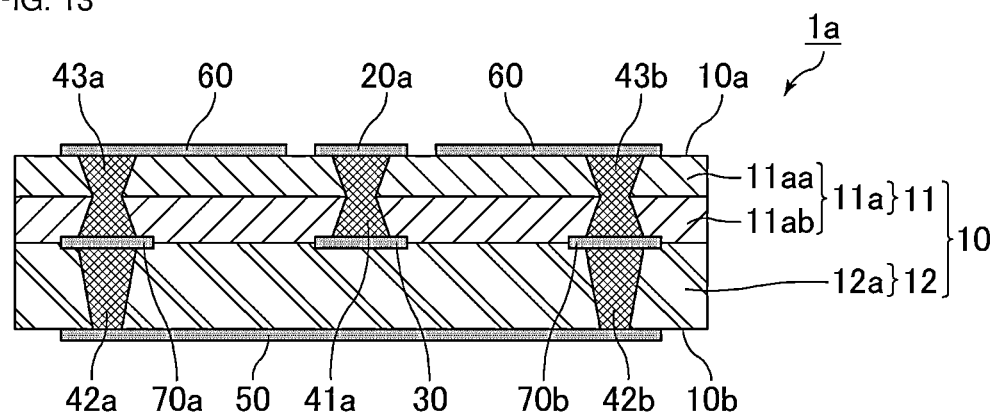
FIG. 13 is a schematic cross-sectional view illustrating a multilayer substrate according to a modification of Preferred Embodiment 1 of the present invention.

FIG. 13 is a schematic cross-sectional view illustrating a multilayer substrate according to a modification of Preferred Embodiment 1 of the present invention. FIG. 13 illustrates a cross-section corresponding to FIG. 2.

As illustrated in FIG. 13, in a multilayer substrate 1a, the first thermoplastic resin layer 11a includes a first thermoplastic resin sublayer 11aa and a first thermoplastic resin sublayer 11ab. To be more specific, in the first thermoplastic resin layer 11a, the first thermoplastic resin sublayer 11ab and the first thermoplastic resin sublayer 11aa adjacent to the first thermoplastic resin sublayer 11ab are provided in this order from the second laminate portion 12 side.

In the multilayer substrate 1a, the storage elastic modulus of the first thermoplastic resin layer 11a is lower than the storage elastic modulus of the second thermoplastic resin layer 12a at a measurement temperature equal to or higher than the minimum melting point among the melting points of the metallic elements included in the first interlayer connection conductor 41a and the first interlayer connection conductor 41*b* and equal to or lower than the melting points of the first thermoplastic resin layer 11*a* and the second thermoplastic resin layer 12*a*.

In the multilayer substrate 1*a*, when the storage elastic modulus of the first thermoplastic resin layer 11*a* as a whole is lower than the storage elastic modulus of the second thermoplastic resin layer 12*a* at the above measurement temperature, the storage elastic moduli of the first thermoplastic resin sublayer 11*aa* and the first thermoplastic resin sublayer 11*ab* may be lower than the storage elastic modulus of the second thermoplastic resin layer 12*a*, or the storage elastic modulus of one of the first thermoplastic resin sublayer 11*aa* and the first thermoplastic resin sublayer 11*ab* may be the same as the storage elastic modulus of the second thermoplastic resin layer 12*a*.

When the storage elastic moduli of the first thermoplastic resin sublayer 11*aa* and the first thermoplastic resin sublayer 11*ab* are lower than the storage elastic modulus of the second thermoplastic resin layer 12*a* at the above measurement temperature, the storage elastic modulus of the first thermoplastic resin sublayer 11*aa* and the storage elastic modulus of the first thermoplastic resin sublayer 11*ab* may be the same as or different from each other.

When the storage elastic modulus of the first thermoplastic resin sublayer 11*aa* and the storage elastic modulus of the first thermoplastic resin sublayer 11*ab* at the above measurement temperature are different from each other, for example, the first thermoplastic resin sublayer 11*aa* may include a liquid crystal polymer as a main component, and the first thermoplastic resin sublayer 11*ab* may include a fluorine resin as a main component. In addition, for example, the first thermoplastic resin sublayer 11*aa* may include a fluorine resin as a main component, and the first thermoplastic resin sublayer 11*ab* may include a liquid crystal polymer as a main component. Since the fluorine resin has a relatively low storage elastic modulus among the thermoplastic resins described above, when the first thermoplastic resin sublayer 11*aa* or the first thermoplastic resin sublayer 11*ab* includes the fluorine resin as a main component, the storage elastic modulus of the first thermoplastic resin layer 11*a* as a whole at the above measurement temperature is likely to be low.

As described above, the first conductor pattern 30 is likely to affect, due to the large length thereof in the transmission direction orthogonal or substantially orthogonal to the lamination direction, the loss of the electric energy. Therefore, the dielectric loss tangent of the first thermoplastic resin sublayer 11*ab* provided so as to be in contact with the first conductor pattern 30 is preferably lower than the dielectric loss tangent of the first thermoplastic resin sublayer 11*aa*. In other words, of the two first thermoplastic resin sublayers, the first thermoplastic resin sublayer having the smallest dielectric loss tangent is preferably provided so as to be in contact with the first conductor pattern 30. As such, it is possible to reduce the loss of the electric energy in the first conductor pattern 30.

In the multilayer substrate 1*a*, the first thermoplastic resin layer 11*a* includes two first thermoplastic resin sublayers, but may include three or more first thermoplastic resin sublayers.

In a case where the first thermoplastic resin layer 11*a* includes three or more first thermoplastic resin sublayers, when the storage elastic modulus of the first thermoplastic resin layer 11*a* as a whole is lower than the storage elastic modulus of the second thermoplastic resin layer 12*a* at the above measurement temperature, the storage elastic moduli of these first thermoplastic resin sublayers may be lower than the storage elastic modulus of the second thermoplastic resin layer 12*a*, or the storage elastic modulus of a portion of these first thermoplastic resin sublayers may be the same or substantially the same as the storage elastic modulus of the second thermoplastic resin layer 12*a*. When the storage elastic moduli of these first thermoplastic resin sublayers are lower than the storage elastic modulus of the second thermoplastic resin layer 12*a* at the above measurement temperature, the storage elastic moduli of these first thermoplastic resin sublayers may be the same or substantially the same as or different from each other. In addition, from the viewpoint of reducing the loss of the electric energy in the first conductor pattern 30, it is preferable that the first thermoplastic resin sublayer having the smallest dielectric loss tangent among these first thermoplastic resin sublayers is provided so as to be in contact with the first conductor pattern 30.

In the multilayer substrate 1*a*, the second thermoplastic resin layer 12*a* includes one layer, but may include a plurality of second thermoplastic resin sublayers.

When the first thermoplastic resin layer 11*a* includes a plurality of first thermoplastic resin sublayers and the second thermoplastic resin layer 12*a* includes a plurality of second thermoplastic resin sublayers, the maximum value of the storage elastic moduli of the plurality of first thermoplastic resin sublayers only needs to be lower than the minimum value of the storage elastic moduli of the plurality of second thermoplastic resin sublayers at the above measurement temperature. The storage elastic moduli of the plurality of second thermoplastic resin sublayers may be the same as or different from each other as long as they are higher than the maximum value of the storage elastic moduli of the plurality of first thermoplastic resin sublayers.

In a case where the thermoplastic resin layer includes a plurality of layers such as a case where the first thermoplastic resin layer 11*a* includes the plurality of first thermoplastic resin sublayers or a case where the second thermoplastic resin layer 12*a* includes the plurality of second thermoplastic resin sublayers, the temperature dependence of the storage elastic modulus of the thermoplastic resin layer as a whole can be measured by dynamic viscoelasticity measurement by using a thermoplastic resin layer composed of a plurality of layers as a measurement sample.

Preferred Embodiment 2

In a multilayer substrate according to a preferred embodiment of the present invention, the first laminate portion may include a plurality of first thermoplastic resin layers, and each of the plurality of first thermoplastic resin layers may be provided with at least one first interlayer connection conductor. An example of such a multilayer substrate will be described below as a multilayer substrate according to Preferred Embodiment 2 of the present invention. The multilayer substrate of Preferred Embodiment 2 of the present invention is the same or substantially the same as the multilayer substrate of Preferred Embodiment 1 of the present invention except for the configuration of the resin multilayer body.

Figure 14:
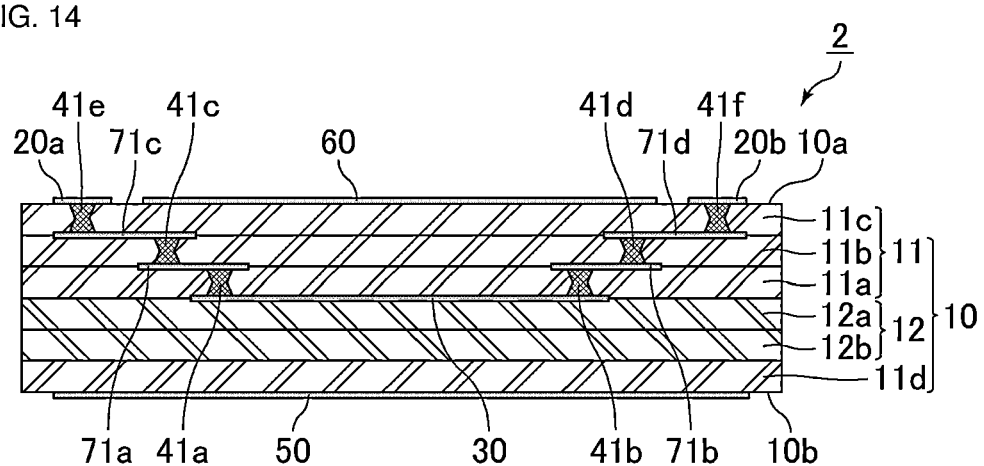
FIG. 14 is a schematic cross-sectional view illustrating a multilayer substrate according to Preferred Embodiment 2 of the present invention.

FIG. 14 is a schematic cross-sectional view illustrating a multilayer substrate according to Preferred Embodiment 2 of the present invention. FIG. 14 illustrates a cross-section corresponding to FIG. 3.

As illustrated in FIG. 14, in a multilayer substrate 2, the first laminate portion 11 includes the first thermoplastic resin layer 11*a*, a first thermoplastic resin layer 11*b*, and a first thermoplastic resin layer 11*c*. In the first laminate portion 11, the first thermoplastic resin layer 11a, the first thermoplastic resin layer 11b adjacent to the first thermoplastic resin layer 11a, and the first thermoplastic resin layer 11c adjacent to the first thermoplastic resin layer 11b are provided in this order from the second laminate portion 12 side. As described above, in the first laminate portion 11, since the first thermoplastic resin layers of the same type such as the first thermoplastic resin layer 11a, the first thermoplastic resin layer 11b, and the first thermoplastic resin layer 11c are laminated in the lamination direction, a close contact property between the respective first thermoplastic resin layers is high.

In the first thermoplastic resin layer 11a, the first interlayer connection conductor 41a and the first interlayer connection conductor 41b extend through the first thermoplastic resin layer 11a in the lamination direction at positions spaced apart from each other.

In the first thermoplastic resin layer 11b, a first interlayer connection conductor 41c and a first interlayer connection conductor 41d extend through the first thermoplastic resin layer 11b in the lamination direction at positions spaced apart from each other.

In the first thermoplastic resin layer 11c, a first interlayer connection conductor 41e and a first interlayer connection conductor 41f extend through the first thermoplastic resin layer 11c in the lamination direction at positions spaced apart from each other.

In the transmission direction orthogonal or substantially orthogonal to the lamination direction, the lengths of the first interlayer connection conductor 41c, the first interlayer connection conductor 41d, the first interlayer connection conductor 41e, and the first interlayer connection conductor 41f are each smaller than the length of the first conductor pattern 30, similar to the lengths of the first interlayer connection conductor 41a and the first interlayer connection conductor 41b.

The first interlayer connection conductor 41c, the first interlayer connection conductor 41d, the first interlayer connection conductor 41e, and the first interlayer connection conductor 41f each include, for example, resins and at least one kind of metallic element, similar to the first interlayer connection conductor 41a and the first interlayer connection conductor 41b.

The resins included in the first interlayer connection conductor 41a, the first interlayer connection conductor 41b, the first interlayer connection conductor 41c, the first interlayer connection conductor 41d, the first interlayer connection conductor 41e, and the first interlayer connection conductor 41f are preferably the same as each other, but may be different from each other. In addition, the metallic elements included in the first interlayer connection conductor 41a, the first interlayer connection conductor 41b, the first interlayer connection conductor 41c, the first interlayer connection conductor 41d, the first interlayer connection conductor 41e, and the first interlayer connection conductor 41f are preferably the same as each other, but may be different from each other. In other words, it is preferable that the first interlayer connection conductor 41a, the first interlayer connection conductor 41b, the first interlayer connection conductor 41c, the first interlayer connection conductor 41d, the first interlayer connection conductor 41e, and the first interlayer connection conductor 41f include the same resins and the same metallic elements as each other.

As illustrated in FIG. 14, the multilayer substrate 2 may further include a connection conductor layer 71a, a connection conductor layer 71b, a connection conductor layer 71c, and a connection conductor layer 71d.

The connection conductor layer 71a is provided between the first thermoplastic resin layer 11a and the first thermoplastic resin layer 11b. The connection conductor layer 71a is preferably provided across the boundary between the first thermoplastic resin layer 11a and the first thermoplastic resin layer 11b. As a result, the interface between the connection conductor layer 71a and the first thermoplastic resin layer 11a and the interface between the connection conductor layer 71a and the first thermoplastic resin layer 11b are deviated from the interface between the first thermoplastic resin layer 11a and the first thermoplastic resin layer 11b in the lamination direction, so that the peeling at the interface between the connection conductor layer 71a and the first thermoplastic resin layer 11a and the peeling at the interface between the connection conductor layer 71a and the first thermoplastic resin layer 11b are reduced or prevented.

The connection conductor layer 71a electrically connects the first interlayer connection conductor 41a and the first interlayer connection conductor 41c.

The connection conductor layer 71b is provided at a position spaced apart from the connection conductor layer 71a between the first thermoplastic resin layer 11a and the first thermoplastic resin layer 11b. The connection conductor layer 71b is preferably provided at a position spaced apart from the connection conductor layer 71b across the boundary between the first thermoplastic resin layer 11a and the first thermoplastic resin layer 11b. As a result, the interface between the connection conductor layer 71b and the first thermoplastic resin layer 11a and the interface between the connection conductor layer 71b and the first thermoplastic resin layer 11b are deviated from the interface between the first thermoplastic resin layer 11a and the first thermoplastic resin layer 11b in the lamination direction, so that the peeling at the interface between the connection conductor layer 71b and the first thermoplastic resin layer 11a and the peeling at the interface between the connection conductor layer 71b and the first thermoplastic resin layer 11b are reduced or prevented.

The connection conductor layer 71b electrically connects the first interlayer connection conductor 41b and the first interlayer connection conductor 41d.

The connection conductor layer 71c is provided between the first thermoplastic resin layer 11b and the first thermoplastic resin layer 11c. The connection conductor layer 71c is preferably provided across the boundary between the first thermoplastic resin layer 11b and the first thermoplastic resin layer 11c. As a result, the interface between the connection conductor layer 71c and the first thermoplastic resin layer 11b and the interface between the connection conductor layer 71c and the first thermoplastic resin layer 11c are deviated from the interface between the first thermoplastic resin layer 11b and the first thermoplastic resin layer 11c in the lamination direction, so that the peeling at the interface between the connection conductor layer 71c and the first thermoplastic resin layer 11b and the peeling at the interface between the connection conductor layer 71c and the first thermoplastic resin layer 11c are reduced or prevented.

The connection conductor layer 71c electrically connects the first interlayer connection conductor 41c and the first interlayer connection conductor 41e.

The connection conductor layer 71d is provided at a position spaced apart from the connection conductor layer 71c between the first thermoplastic resin layer 11b and the first thermoplastic resin layer 11c. The connection conductor layer 71d is preferably provided at a position spaced apart from the connection conductor layer 71c across the boundary between the first thermoplastic resin layer 11b and the first thermoplastic resin layer 11c. As a result, the interface between the connection conductor layer 71d and the first thermoplastic resin layer 11b and the interface between the connection conductor layer 71d and the first thermoplastic resin layer 11c are deviated from the interface between the first thermoplastic resin layer 11b and the first thermoplastic resin layer 11c in the lamination direction, so that the peeling at the interface between the connection conductor layer 71d and the first thermoplastic resin layer 11b and the peeling at the interface between the connection conductor layer 71d and the first thermoplastic resin layer 11c are reduced or prevented.

The connection conductor layer 71d electrically connects the first interlayer connection conductor 41d and the first interlayer connection conductor 41f.

In the transmission direction orthogonal or substantially orthogonal to the lamination direction, the lengths of the connection conductor layer 71a, the connection conductor layer 71b, the connection conductor layer 71c, and the connection conductor layer 71d are each smaller than the length of the first conductor pattern 30, similar to the lengths of the connection conductor layer 70a, the connection conductor layer 70b, the connection conductor layer 70c, and the connection conductor layer 70d.

Examples of the materials of the connection conductor layer 71a, the connection conductor layer 71b, the connection conductor layer 71c, and the connection conductor layer 71d include the same materials as those of the connection conductor layer 70a, the connection conductor layer 70b, the connection conductor layer 70c, and the connection conductor layer 70d.

The materials of the connection conductor layer 71a, the connection conductor layer 71b, the connection conductor layer 71c, and the connection conductor layer 71d are preferably the same as each other, but may be different from each other.

In the multilayer substrate 2, the first laminate portion 11 includes three first thermoplastic resin layers, but may include two first thermoplastic resin layers, or may include four or more first thermoplastic resin layers.

The second laminate portion 12 may include a plurality of second thermoplastic resin layers. For example, as illustrated in FIG. 14, the second laminate portion 12 may include the second thermoplastic resin layer 12a and a second thermoplastic resin layer 12b. In the second laminate portion 12, the second thermoplastic resin layer 12a and the second thermoplastic resin layer 12b adjacent to the second thermoplastic resin layer 12a are provided in this order from the first laminate portion 11 side. As described above, in the second laminate portion 12, since the second thermoplastic resin layers of the same type such as the second thermoplastic resin layer 12a and the second thermoplastic resin layer 12b are laminated in the lamination direction, the close contact property between the respective second thermoplastic resin layers is high.

In the multilayer substrate 2, there are the boundary between the first thermoplastic resin layers of the same type such as the first thermoplastic resin layer 11a, the first thermoplastic resin layer 11b, and the first thermoplastic resin layer 11c, and the boundary between the second thermoplastic resin layers of the same type such as the second thermoplastic resin layer 12a and the second thermoplastic resin layer 12b, and even such boundaries can be determined by observing the cross section along the lamination direction as illustrated in FIG. 14 by infrared spectrometry or observing the positions of the end portions of the respective interlayer connection conductors as described above.

In a multilayer substrate according to a preferred embodiment of the present invention, when the first laminate portion includes a plurality of first thermoplastic resin layers and the second laminate portion includes a plurality of second thermoplastic resin layers, the storage elastic moduli of all the first thermoplastic resin layers of the first laminate portion are lower than the storage elastic moduli of all the second thermoplastic resin layers of the second laminate portion at a measurement temperature equal to or higher than the minimum melting point among the melting points of the metallic elements included in the first interlayer connection conductor and equal to or lower than the melting points of the plurality of first thermoplastic resin layers and the plurality of second thermoplastic resin layers.

In the multilayer substrate 2, at a measurement temperature equal to or higher than the minimum melting point among the melting points of the metallic elements included in the first interlayer connection conductor 41a, the first interlayer connection conductor 41b, the first interlayer connection conductor 41c, the first interlayer connection conductor 41d, the first interlayer connection conductor 41e, and the first interlayer connection conductor 41f and equal to or lower than the melting points of the first thermoplastic resin layer 11a, the first thermoplastic resin layer 11b, the first thermoplastic resin layer 11c, the second thermoplastic resin layer 12a, and the second thermoplastic resin layer 12b, the storage elastic moduli of the first thermoplastic resin layer 11a, the first thermoplastic resin layer 11b, and the first thermoplastic resin layer 11c are lower than the storage elastic moduli of the second thermoplastic resin layer 12a and the second thermoplastic resin layer 12b. As such, each of the first interlayer connection conductor 41a, the first interlayer connection conductor 41b, the first interlayer connection conductor 41c, the first interlayer connection conductor 41d, the first interlayer connection conductor 41e, and the first interlayer connection conductor 41f has high denseness.

In the multilayer substrate 2, the surface electrodes 20a and the first conductor pattern 30 are electrically connected to each other via the first interlayer connection conductor 41a, the connection conductor layer 71a, the first interlayer connection conductor 41c, the connection conductor layer 71c, and the first interlayer connection conductor 41e. As described above, in the multilayer substrate 2, since the first interlayer connection conductors that electrically connect the surface electrodes 20a and the first conductor pattern 30 are the first interlayer connection conductor 41a, the first interlayer connection conductor 41c, and the first interlayer connection conductor 41e each having high denseness, the connectivity between the surface electrode 20a and the first conductor pattern 30 is likely to increase.

In the multilayer substrate 2, the first interlayer connection conductor 41a, the first interlayer connection conductor 41c, and the first interlayer connection conductor 41e are provided so as not to overlap each other when viewed from the lamination direction, but may be provided so as to overlap each other. Alternatively, the first interlayer connection conductors electrically connecting the surface electrode 20a and the first conductor pattern 30 may be provided so as to extend through two or more first thermoplastic resin layers.

In the multilayer substrate 2, the surface electrode 20b and the first conductor pattern 30 are electrically connected to each other via the first interlayer connection conductor 41b, the connection conductor layer 71b, the first interlayer connection conductor 41d, the connection conductor layer 71d, and the first interlayer connection conductor 41f. As described above, in the multilayer substrate 2, since the first interlayer connection conductors that electrically connect the surface electrode 20b and the first conductor pattern 30 are the first interlayer connection conductor 41b, the first interlayer connection conductor 41d, and the first interlayer connection conductor 41f each having high denseness, the connectivity between the surface electrode 20b and the first conductor pattern 30 is likely to increase.

In the multilayer substrate 2, the first interlayer connection conductor 41b, the first interlayer connection conductor 41d, and the first interlayer connection conductor 41f are provided so as not to overlap each other when viewed from the lamination direction, but may be provided so as to overlap each other. Alternatively, the first interlayer connection conductors electrically connecting the surface electrode 20b and the first conductor pattern 30 may be provided so as to extend through two or more first thermoplastic resin layers.

At the above measurement temperature, the first thermoplastic resin layer 11a, the first thermoplastic resin layer 11b, and the first thermoplastic resin layer 11c preferably each have the same or substantially the same storage elastic modulus. As a result, in the first laminate portion 11, the close contact property between the first thermoplastic resin layer 11a, the first thermoplastic resin layer 11b, and the first thermoplastic resin layer 11c is likely to increase. In this case, the thermoplastic resins of the first thermoplastic resin layer 11a, the first thermoplastic resin layer 11b, and the first thermoplastic resin layer 11c are preferably the same as each other, but may be different from each other.

At the measurement temperature, the storage elastic moduli of the first thermoplastic resin layer 11a, the first thermoplastic resin layer 11b, and the first thermoplastic resin layer 11c may be different from each other. In this case, the thermoplastic resins of the first thermoplastic resin layer 11a, the first thermoplastic resin layer 11b, and the first thermoplastic resin layer 11c may be the same as or different from each other.

At the measurement temperature, the storage elastic moduli of the second thermoplastic resin layer 12a and the second thermoplastic resin layer 12b may be the same as or different from each other. In any case, the thermoplastic resins of the second thermoplastic resin layer 12a and the second thermoplastic resin layer 12b may be the same as or different from each other. In addition, the thermoplastic resins of the second thermoplastic resin layer 12a and the second thermoplastic resin layer 12b may be the same as or different from the thermoplastic resins forming the first thermoplastic resin layer 11a, the first thermoplastic resin layer 11b, and the first thermoplastic resin layer 11c.

Each of the first thermoplastic resin layer 11a, the first thermoplastic resin layer 11b, the first thermoplastic resin layer 11c, the second thermoplastic resin layer 12a, and the second thermoplastic resin layer 12b may include, for example, a liquid crystal polymer as a main component. In this case, the molecular weights of the liquid crystal polymers of the first thermoplastic resin layer 11a, the first thermoplastic resin layer 11b, and the first thermoplastic resin layer 11c are preferably different from the molecular weights of the liquid crystal polymers forming the second thermoplastic resin layer 12a and the second thermoplastic resin layer 12b. As a result, the storage elastic moduli of the first thermoplastic resin layer 11a, the first thermoplastic resin layer 11b, and the first thermoplastic resin layer 11c can be made lower than the storage elastic moduli of the second thermoplastic resin layer 12a and the second thermoplastic resin layer 12b.

In the multilayer substrate 2, the resin multilayer body 10 may further include at least one first thermoplastic resin layer on the opposite side of the second laminate portion 12 from the first laminate portion 11. For example, as illustrated in FIG. 14, the resin multilayer body 10 may further include a first thermoplastic resin layer 11d on the opposite side of the second laminate portion 12 from the first laminate portion 11. As described above, by providing at least one first thermoplastic resin layer, here, the first thermoplastic resin layer 11d, the impedance of the multilayer substrate 2 can be appropriately adjusted.

When the resin multilayer body 10 includes the first thermoplastic resin layer 11d in the multilayer substrate 2, the storage elastic modulus of the first thermoplastic resin layer 11d is lower than the storage elastic moduli of the second thermoplastic resin layer 12a and the second thermoplastic resin layer 12b at a measurement temperature equal to or higher than the minimum melting point among the melting points of the metallic elements included in the first interlayer connection conductor 41a, the first interlayer connection conductor 41b, the first interlayer connection conductor 41c, the first interlayer connection conductor 41d, the first interlayer connection conductor 41e, and the first interlayer connection conductor 41f and equal to or lower than the melting points of the first thermoplastic resin layer 11d, the second thermoplastic resin layer 12a, and the second thermoplastic resin layer 12b.

In addition, when the resin multilayer body 10 includes the first thermoplastic resin layer 11d in the multilayer substrate 2, the storage elastic moduli of the first thermoplastic resin layer 11a, the first thermoplastic resin layer 11b, the first thermoplastic resin layer 11c, and the first thermoplastic resin layer 11d are preferably lower than the storage elastic moduli of the second thermoplastic resin layer 12a and the second thermoplastic resin layer 12b at a measurement temperature equal to or higher than the minimum melting point among the melting points of the metallic elements included in the first interlayer connection conductor 41a, the first interlayer connection conductor 41b, the first interlayer connection conductor 41c, the first interlayer connection conductor 41d, the first interlayer connection conductor 41e, and the first interlayer connection conductor 41f and equal to or lower than the melting points of the first thermoplastic resin layer 11a, the first thermoplastic resin layer 11b, the first thermoplastic resin layer 11c, the first thermoplastic resin layer 11d, the second thermoplastic resin layer 12a, and the second thermoplastic resin layer 12b.

In the multilayer substrate 2, the storage elastic modulus of the first thermoplastic resin layer 11d may be the same as or different from the storage elastic modulus of the first thermoplastic resin layer 11a, the first thermoplastic resin layer 11b, and the first thermoplastic resin layer 11c at any of the measurement temperatures described above. In any case, the thermoplastic resin of the first thermoplastic resin layer 11d may be the same as or different from the thermoplastic resins of the first thermoplastic resin layer 11a, the first thermoplastic resin layer 11b, and the first thermoplastic resin layer 11c.

When a plurality of first conductor patterns 30 is present in the multilayer substrate 2 and all of the first conductor patterns 30 are electrically connected to the surface electrodes provided on the first main surface 10a of the resin multilayer body 10 via the first interlayer connection conductors, all of the first conductor patterns 30 are preferably provided so as to be in contact with the first thermoplastic resin layers of the first laminate portion 11. In this case, among all of the first conductor patterns 30, the first conductor pattern 30 in the lowermost layer, that is, the first conductor pattern 30 provided between the first laminate portion 11 and the second laminate portion 12 preferably has the largest length in the transmission direction orthogonal to the lamination direction.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
   a resin multilayer body including, in a lamination direction, a first laminate portion including at least one first thermoplastic resin layer and a second laminate portion adjacent to the first laminate portion and including at least one second thermoplastic resin layer, and including a first main surface on a side of the first laminate portion and a second main surface on a side of the second laminate portion, the first main surface and the second main surface facing each other in the lamination direction;
   a surface electrode on the first main surface of the resin multilayer body;
   a first conductor pattern between the first laminate portion and the second laminate portion to provide signal or power transmission; and
   at least one first interlayer connection conductor extending through the first thermoplastic resin layer in the lamination direction and electrically connecting the surface electrode and the first conductor pattern; wherein
   in the lamination direction, one surface of the first conductor pattern on a side of the surface electrode is connected to the first interlayer connection conductor, and another surface of the first conductor pattern on a side opposite to the surface electrode is not connected to an interlayer connection conductor;
   the first interlayer connection conductor includes a resin and at least one metallic element; and
   a storage elastic modulus of the first thermoplastic resin layer is lower than a storage elastic modulus of the second thermoplastic resin layer at a measurement temperature equal to or higher than a minimum melting point among melting points of the at least one metallic element included in the first interlayer connection conductor and equal to or lower than melting points of the at least one first thermoplastic resin layer and the at least one second thermoplastic resin layer.

2. The multilayer substrate according to claim 1, wherein the first interlayer connection conductor includes tin as the at least one metallic element having the minimum melting point.

3. The multilayer substrate according to claim 1, wherein the first interlayer connection conductor includes copper as the at least one metallic element.

4. The multilayer substrate according to claim 1, wherein the first interlayer connection conductor has a cross-sectional area smaller than each of a cross-sectional area of an end portion on a side of the first conductor pattern and a cross-sectional area of an end portion on a side opposite to the first conductor pattern in a cross-section orthogonal or substantially orthogonal to the lamination direction.

5. The multilayer substrate according to claim 1, further comprising a second conductor pattern to provide grounding and located on a side of the second main surface of the resin multilayer body with respect to the first conductor pattern and overlapping the first conductor pattern when viewed from the lamination direction.

6. The multilayer substrate according to claim 5, further comprising a plurality of second interlayer connection conductors extending through the at least one second thermoplastic resin layer in the lamination direction at positions sandwiching the first interlayer connection conductor when viewed from the lamination direction, and electrically connected to the second conductor pattern.

7. The multilayer substrate according to claim 6, wherein in a cross section orthogonal or substantially orthogonal to the lamination direction, a cross-sectional area of an end portion of the second interlayer connection conductor on the second conductor pattern side is smaller than a cross-sectional area of an end portion of the first interlayer connection conductor on a side of the first conductor pattern.

8. The multilayer substrate according to claim 6, wherein a void ratio of the first interlayer connection conductor is lower than a void ratio of the second interlayer connection conductor.

9. The multilayer substrate according to claim 5, wherein a dielectric loss tangent of the at least one second thermoplastic resin layer is smaller than a dielectric loss tangent of the at least one first thermoplastic resin layer.

10. The multilayer substrate according to claim 1, wherein the at least one first thermoplastic resin layer and the at least one second thermoplastic resin layer each include a liquid crystal polymer as a main component.

11. The multilayer substrate according to claim 1, wherein
    the first laminate portion includes a plurality of the first thermoplastic resin layers; and
    each of the plurality of first thermoplastic resin layers includes the at least one first interlayer connection conductor.

12. The multilayer substrate according to claim 11, further comprising:
    at least one connection conductor layer electrically connecting the first interlayer connection conductors in each of the first thermoplastic resin layers to each other between the two first thermoplastic resin layers adjacent to each other in the lamination direction; wherein
    a length of the connection conductor layer is smaller than a length of the first conductor pattern in a transmission direction orthogonal or substantially orthogonal to the lamination direction.

13. The multilayer substrate according to claim 11, wherein storage elastic moduli of the plurality of first thermoplastic resin layers are the same or substantially the same as each other at the measurement temperature.

14. The multilayer substrate according to claim 10, wherein a molecular weight of the liquid crystal polymer included in the at least one first thermoplastic resin layer and a molecular weight of the liquid crystal polymer in the at least one second thermoplastic resin layer are different from each other.

15. The multilayer substrate according to claim 1, further comprising another surface electrode on the first main surface of the resin multilayer body at a position spaced apart from the surface electrode.

16. The multilayer substrate according to claim 1, wherein the surface electrode includes at least one of copper, silver, aluminum, stainless steel, nickel, or gold, or an alloy including at least one of copper, silver, aluminum, stainless steel, nickel, or gold.

17. The multilayer substrate according to claim 1, wherein the first conductor pattern extending across a boundary between the at least one first thermoplastic resin layer and the at least one second thermoplastic resin layer.

18. The multilayer substrate according to claim 17, wherein an interface between the first conductor pattern and the at least one first thermoplastic resin layer and an interface between the first conductor pattern and the at least one second thermoplastic resin layer are deviated from an interface between the at least one first thermoplastic resin layer and the at least one second thermoplastic resin layer in the lamination direction.

19. The multilayer substrate according to claim 1, wherein the first conductor pattern includes at least one of copper, silver, aluminum, stainless steel, nickel, or gold, or an alloy including at least one of copper, silver, aluminum, stainless steel, nickel, or gold.

\* \* \* \* \*